(12) United States Patent
Yoshimura et al.

(10) Patent No.: US 11,128,131 B2
(45) Date of Patent: Sep. 21, 2021

(54) SEMICONDUCTOR DEVICE

(71) Applicant: RENESAS ELECTRONICS CORPORATION, Tokyo (JP)

(72) Inventors: Naohiro Yoshimura, Tokyo (JP); Osamu Soma, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 103 days.

(21) Appl. No.: 16/554,207

(22) Filed: Aug. 28, 2019

(65) Prior Publication Data

US 2020/0091714 A1 Mar. 19, 2020

(30) Foreign Application Priority Data

Sep. 19, 2018 (JP) .............................. JP2018-175242

(51) Int. Cl.
*H01L 23/00* (2006.01)
*H02H 11/00* (2006.01)
*H02H 1/00* (2006.01)
*H02H 3/04* (2006.01)

(52) U.S. Cl.
CPC .......... *H02H 11/003* (2013.01); *H01L 24/85* (2013.01); *H02H 1/0007* (2013.01); *H02H 3/046* (2013.01)

(58) Field of Classification Search
CPC ............ H01H 37/761; H01L 2924/181; H01L 2924/00012; H01L 2224/48247; H01L 2224/49171; H01L 2224/49113; H01L 2224/32245; H01L 2224/859; H01L 2224/0603; H01L 23/49562; H01L 23/62; H01L 24/49; H01L 24/48; H01L 24/85; H02M 1/088; H02M 1/32; H02H 11/003; H02H 1/0007

See application file for complete search history.

(56) References Cited

U.S. PATENT DOCUMENTS

| 8,698,549 | B2 | 4/2014 | Souma |
| 10,038,316 | B2 | 7/2018 | Tsukamoto et al. |
| 2013/0222048 | A1* | 8/2013 | Souma ...................... H02J 7/34 327/525 |

FOREIGN PATENT DOCUMENTS

| JP | 5845108 B2 | 1/2016 |
| JP | 2017-147751 A | 8/2017 |

* cited by examiner

*Primary Examiner* — Bryan R Perez
(74) *Attorney, Agent, or Firm* — McDermott Will & Emery LLP

(57) ABSTRACT

The power control device reliably disconnects the current path of the failed output transistor. In particular, the power control device includes output transistors, an output terminal, bonding wires connecting the output transistors to the output terminal, output transistor driving circuits controlling the output of the output transistors, and a failure detection circuit detecting the failure of the output transistors. When the failure detection circuit detects the failure of the output transistors and outputs the failure detection signals, the output transistor drive circuits control the outputs of the output transistors so that a larger current flows through the bonding wires than when the failure is not detected.

10 Claims, 18 Drawing Sheets

FIG. 4

| STATE | INPUT SIGNAL | SOURCE VOLTAGE | LOGIC | FAILURE DETECTION CIRCUIT |
|---|---|---|---|---|
| NORMAL | HI | HI | NORMAL | LO |
| NORMAL | LO | LO | NORMAL | LO |
| SHORT-CIRCUIT FAILURE | HI | HI | NORMAL | LO |
| SHORT-CIRCUIT FAILURE | LO | HI | ABNORMAL | HI |

FIG. 11
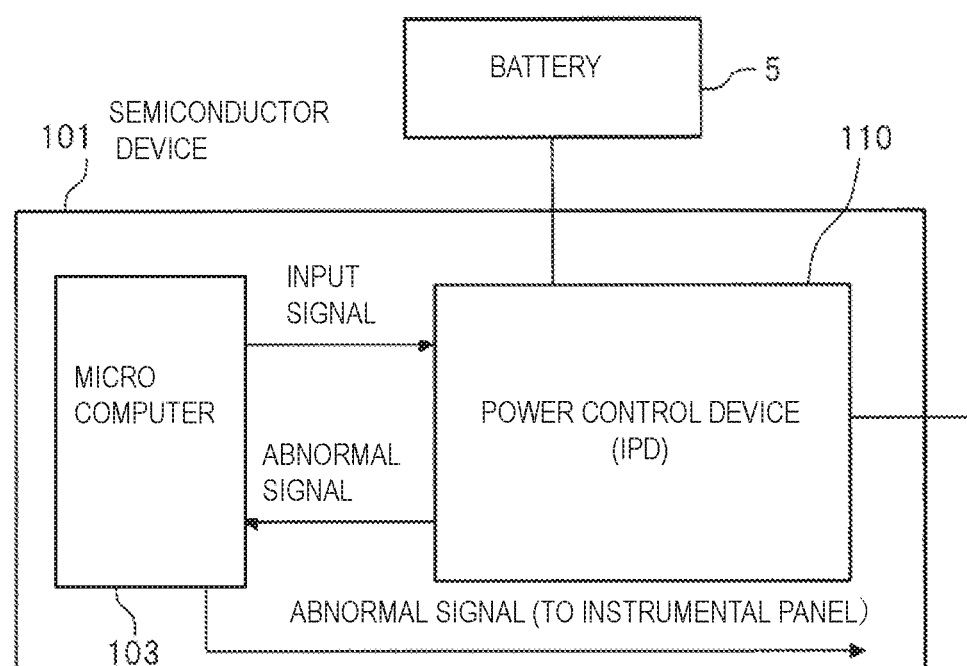
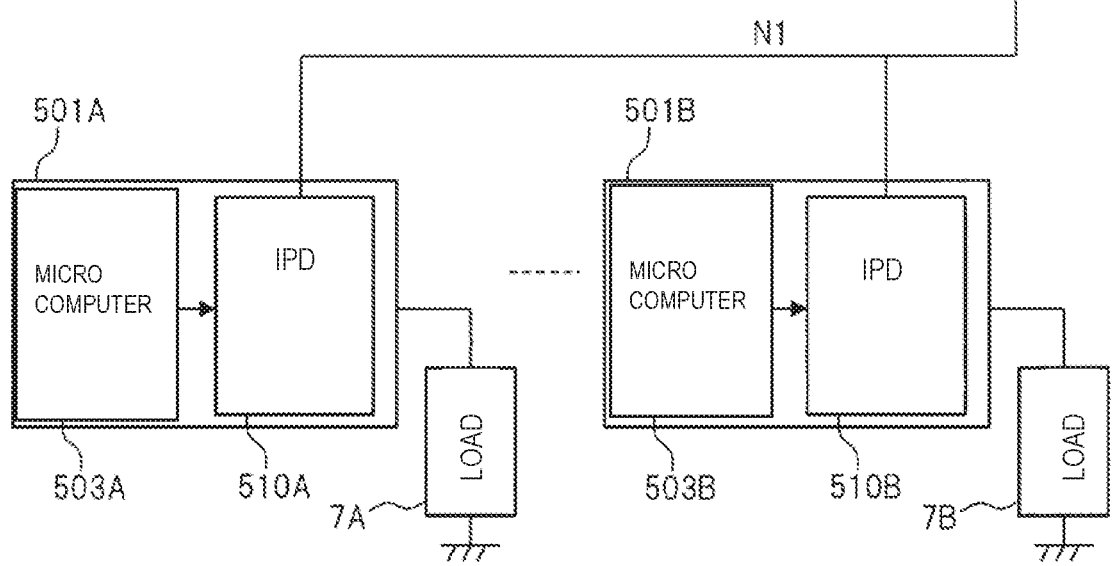

FIG. 16

| STATE | INPUT SIGNAL | SOURCE VOLTAGE | LOGIC (DTERMINATION RESULT) | FAILURE DETECTION CIRCUIT |
|---|---|---|---|---|
| NORMAL | Hi | Hi | NORMAL | LO |
| NORMAL | LO | LO | NORMAL | LO |
| SHORT-CIRCUIT FAILURE | Hi | Hi | ABNORMAL | HI |
| SHORT-CIRCUIT FAILURE | LO | Hi | ABNORMAL | HI |

SEMICONDUCTOR DEVICE

CROSS-REFERENCE TO RELATED APPLICATIONS

The disclosure of Japanese Patent Application No. 2018-175242 filed on Sep. 19, 2018 including the specification, drawings and abstract is incorporated herein by reference in its entirety.

BACKGROUND

The present disclosure relates to a semiconductor device that incorporates a fuse function and can reliably disconnect a defective portion when a fuse failure occurs. A power device for performing power control is provided between an upstream unit such as a battery and a downstream load. If a failure occurs in the power device, power loss due to an overcurrent may occur, and the load device may be damaged. For this reason, a power device is provided which is provided with a countermeasure against the occurrence of a failure.

For example, in Japanese Patent No. 5845108 (hereinafter, Patent Document 1), there is disclosed a power device having a built-in fuse function and capable of operating normally even after a short-circuit failure occurs. The power device of Patent Document 1 includes a plurality of output cells, a plurality of bonding wires provided corresponding to the plurality of output cells, and a control terminal driving circuit. Each of the plurality of output cells has an output transistor. It is assumed that an output transistor is destroyed in a specific output cell among a plurality of output cells. When turned on, the output transistors are energized in all the output cells. Therefore, the loss does not become extremely large, and even if the output transistor is destroyed, the ON operation is normally performed. On the other hand, at the time of OFF, only in the failed output cell, the output transistor is energized, and a current flows to the output transistor in a concentrated manner. As a result, the bonding wire connected to the output cell is fused. This prevents current from flowing in the failed output cell and prevents current from continuing to flow from the first power supply to the load through the short-circuited failed output transistor when off. When the bonding wire is turned on after fused, electric power is supplied from the first power supply to the load through the output cell other than the failed output cell. That is, only the failed output cells fail, and other normal output cells maintain the functionality of the power device.

In Japanese unexamined of Patent Application publication No. 2017-147751, there is disclosed a semiconductor device capable of preventing burnout of a semiconductor device without incorporating fuses.

SUMMARY

In Patent Document 1, if the short-circuit resistance value of the failed output transistor is small, a sufficient current flows through the failed output transistor, so that the bonding wire can be fused without any problem. However, if the short-circuit resistance value of the failure output transistor is large, the current flowing through the failure output transistor becomes small, so that the bonding wire may not be fused. Other objects and novel features will become apparent from the description of this specification and the accompanying drawings.

Although a semiconductor device of a plurality of embodiments is described in this specification, a semiconductor device of one embodiment is as follows. The semiconductor device includes an output transistor, an output terminal, a bonding wire connecting the output transistor and the output terminal, an output transistor driving circuit for controlling the output of the output transistor, and a failure detecting circuit for detecting a failure of the output transistor. When the failure detection circuit detects a failure of the output transistor, the output transistor drive circuit controls the output of the output transistor so that a current larger than that in the case of failure non-detection flows through the bonding wire.

According to one embodiment, it is possible to reliably disconnect the current path of the failure output transistor.

BRIEF DESCRIPTION OF THE DRAWINGS

FIG. 4 is a table shows the operation of the failure detection circuit shown in FIG. 3.

FIG. 11 is a diagram showing a configuration example of a semiconductor device including a power control device and a configuration example of a power control system including a semiconductor device according to a second embodiment.

FIG. 16 is a table shows the operation of the failure detection circuit.

DETAILED DESCRIPTION

Figure 1:
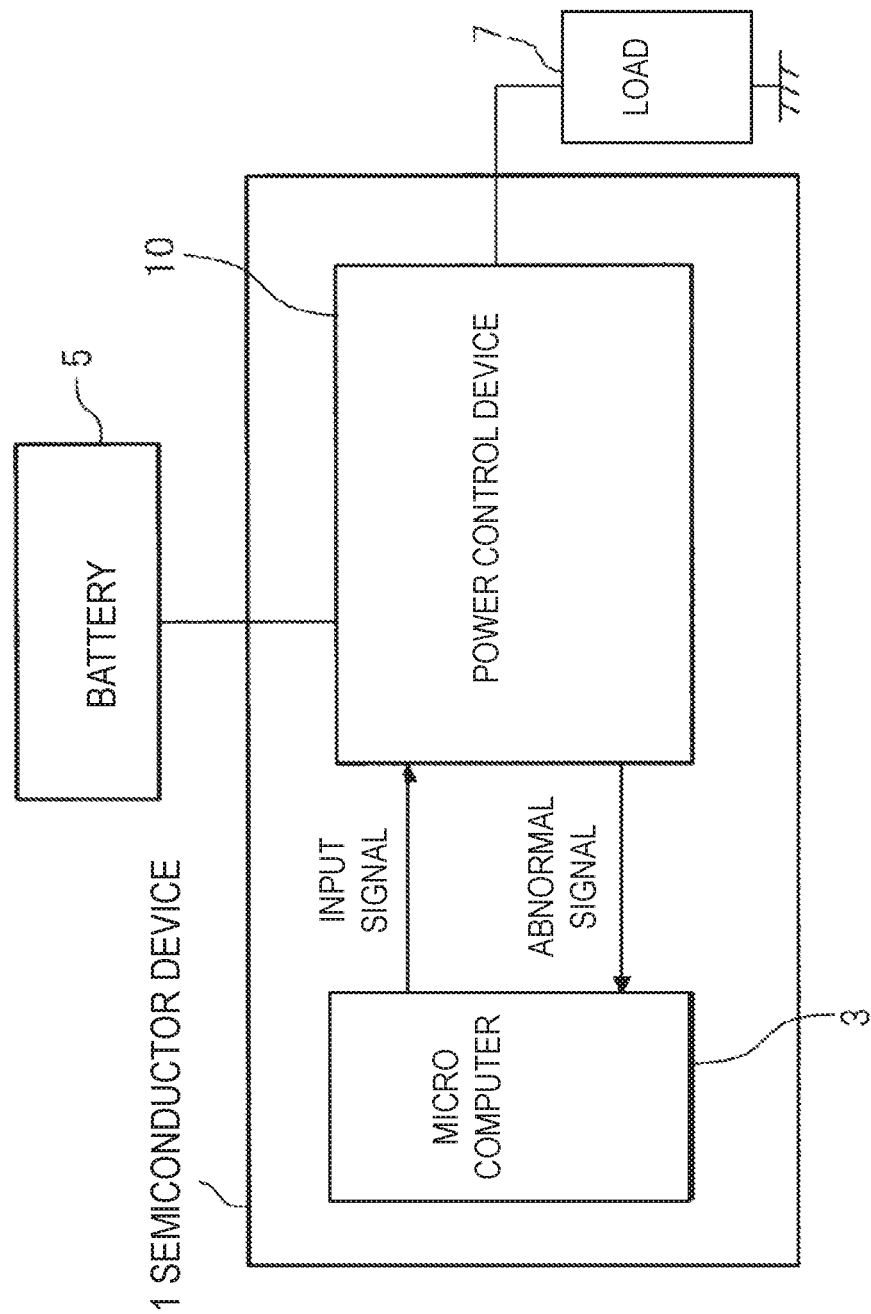
FIG. 1 is a diagram illustrating an exemplary configuration of a semiconductor device including a power control device according to an embodiment of the first embodiment.

In all the drawings for explaining the embodiments, the same portions are denoted by the same reference numerals in principle, and repetitive descriptions thereof are omitted.
(First embodiment) present embodiment describes a semiconductor device with a fuse function. When a failure of the output transistor of the semiconductor device is detected, all the bonding wires connected to the output transistor are fused.

FIG. 1 is a diagram showing an exemplary configuration of a semiconductor device including a power control device according to the first embodiment. As shown in FIG. 1, the semiconductor device 1 includes a microcomputer 3 and a power control device 10.

The power control device 10 is connected to the upstream battery 5 and the downstream load 7, and is a semiconductor device for converting the power of the power supplied from the battery 5 in accordance with the specifications of the load 7. Although an intelligent power device (IPD) for automotive electronics is illustrated in FIG. 1 as a power control device 10, the present embodiment is also applicable to a power control device for other applications.

The microcomputer 3 is a control device of the power control device 10. The microcomputer 3 outputs various signals such as on/off switching signals of the power control device 10, for example.

Figure 2:
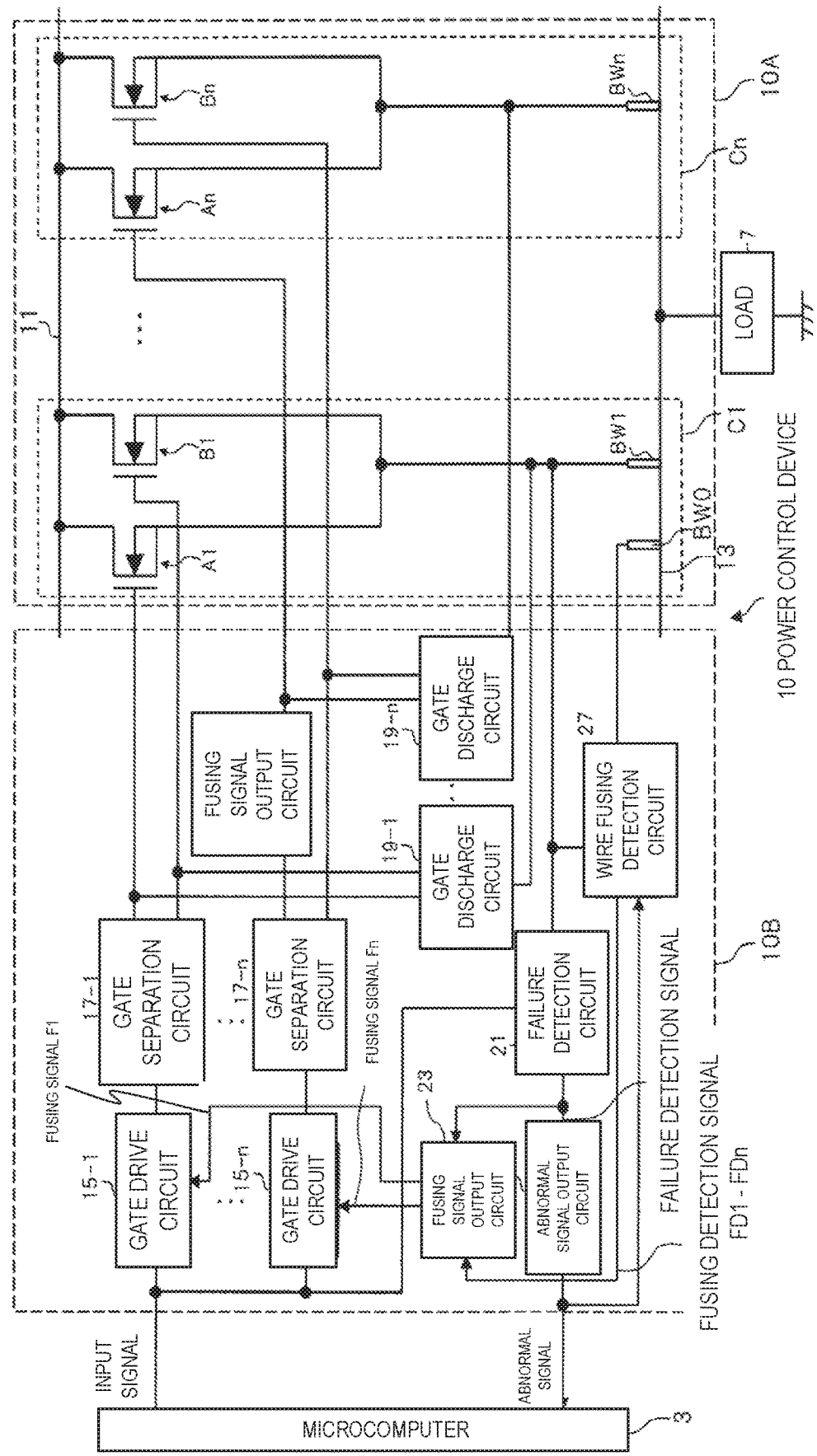
FIG. 2 is a circuit diagram showing an exemplary configuration of a power control device according to the first embodiment.

FIG. 2 is a circuit diagram showing an exemplary configuration of a semiconductor device according to the first embodiment. FIG. 2 also shows the microcomputer 3 and the loads 7 in addition to the power control device 10. As shown in FIG. 2, the power control device 10 includes a power outputting unit 10A and a control unit 10B. The power output unit 10A is a functional block for performing power conversion. The power output unit 10 A includes a power supply terminal 11, an output terminal 13, and output transistors A1 to An and B1 to Bn.

The control unit 10B is a functional block for controlling the power output unit 10A based on the signal output from the microcomputer 3 and the state of the power output unit 10A. The control unit 10B includes gate drive circuits (output transistor drive circuits) 15-1 to 15-n, gate separation circuits 17-1 to 17-n, gate discharge circuits 19-1 to 19-n, a failure detection circuit 21, a fusing signal output circuit 23, an abnormal signal output circuit 25, and a wire fusing detection circuit 27.

Among the output transistors A1 to An and B1 to Bn, the output transistors A1, B1 to An and Bn are respectively included in the same units C1 to Cn as a pair of transistors. The output transistors A1, B1 to An and Bn are connected in parallel between the power supply terminal 11 and the output terminal 13.

The output transistors A1 to An and the output transistors B1 to Bn are, for example, NMOSFET (Negative Metal Oxide Semiconductor Field Effect Transistor) and IGBT (Insulated Gate Bipolar Transistor). The drain terminals of the output transistors A1 to An and B1 to Bn are connected to the power supply terminal 11, and power is supplied from the battery 5 via the power supply terminal 11.

Source terminals of the output transistors A1, B 1 to An, and Bn are connected to the output terminal 13 via corresponding bonding wires BW1 to BWn, respectively. As described above, the power output unit 10A includes a plurality of units each including a bonding wire and a corresponding plurality of output transistors.

The gate terminals of the output transistors A1, B1 to An and Bn are connected to the gate isolation circuits 17-1 to 17-n corresponding to the units C1 to Cn, respectively. The output transistors A1, B1 to An and Bn are switched on and off based on the gate signals output from the gate isolation circuits 17-1 to 17-n.

The gate drive circuits 15-1 to 15-n are circuits for controlling the operation of the output transistors A1, B1 to An, and Bn. The gate drive circuits 15-1 to 15-n are connected to the microcomputer 3 and the corresponding gate isolation circuits 17-1 to 17-n, respectively. The gate drive circuits 15-1 to 15-n output predetermined signals based on input signals output from the microcomputer 3 to the gate separation circuits 17-1 to 17-n.

The gate drive circuits 15-1 to 15-n are also connected to the fusing signal output circuit 23. When the failure of the output transistor is detected, the gate drive circuits 15-1 to 15-n ignore the input signal and control the operation of the output transistors A1, B1 to An, and Bn based on the fusing signal output from the fusing signal output circuit 23. The operation at the time of failure detection will be described later.

The gate isolation circuits 17-1 to 17-n output gate signals to the corresponding output transistors based on the signals output from the corresponding gate drive circuits 15-1 to 15-n. The gate isolation circuits 17-1 to 17-n are provided to prevent the operation (voltage) of other normal output transistors from being affected when the output transistor fails. Therefore, the gate isolation circuits 17-1 to 17-n have different output terminals for the corresponding output transistors.

When a signal for operating the power output unit 10 A is output from the corresponding gate drive circuits 15-1 to 15-n, the gate isolation circuits 17-1 to 17-n output gate signals for turning on the corresponding output transistors A1, B1 to An and Bn, respectively. For example, when a high-level signal (input signal) is input to the gate drive circuits 15-1 to 15-n, a signal for operating the power output unit 10A is output from the gate drive circuits 15-1 to 15-n. Thus, for example, a high-level gate signal is output from the gate separation circuits 17-1 to 17-n. The input signals are input to the gate drive circuits 15-1 to 15-n at substantially the same time. Therefore, the gate isolation circuits 17-1 to 17-n output the high-level gate signals at substantially the same time, and the output transistors A1, B1 to An, and Bn are turned on at substantially the same time.

The gate discharge circuits 19-1 to 19-n are connected to the gate terminals and the drain terminals of the output transistors A1, B1 to An, and Bn of the corresponding units C1 to Cn, respectively. The gate discharge circuits 19-1 to 19-n are functional blocks that discharge the charges of the gates when the output transistors of the corresponding units C1 to Cn are in the off state.

The failure detection circuit 21 is a circuit for detecting a failure of the output transistor. The input side of the failure detection circuit 21 is connected to the microcomputer 3 and the source terminals of the output transistors A1 and B1. However, this is merely an example, and the input side of the failure detection circuit 21 may be connected to the source terminal of another output transistor instead of the source terminals of the output transistors A1 and B1, or may be connected to the output terminal 13. The input side of the failure detection circuit 21 is also connected to the microcomputer 3.

The output side of the failure detection circuit 21 is connected to the fusing signal output circuit 23 and the abnormal signal output circuit 25. The failure detection circuit 21 detects the failure of the output transistor by comparing the failure detection threshold voltage for failure detection with the source voltage of the output transistor, i.e., the voltage of the output terminal 13. When a failure of the output transistor is detected, the failure detection circuit 21 outputs a predetermined failure detection signal to the melting signal output circuit 23 and the abnormal signal output circuit 25.

Figure 3:
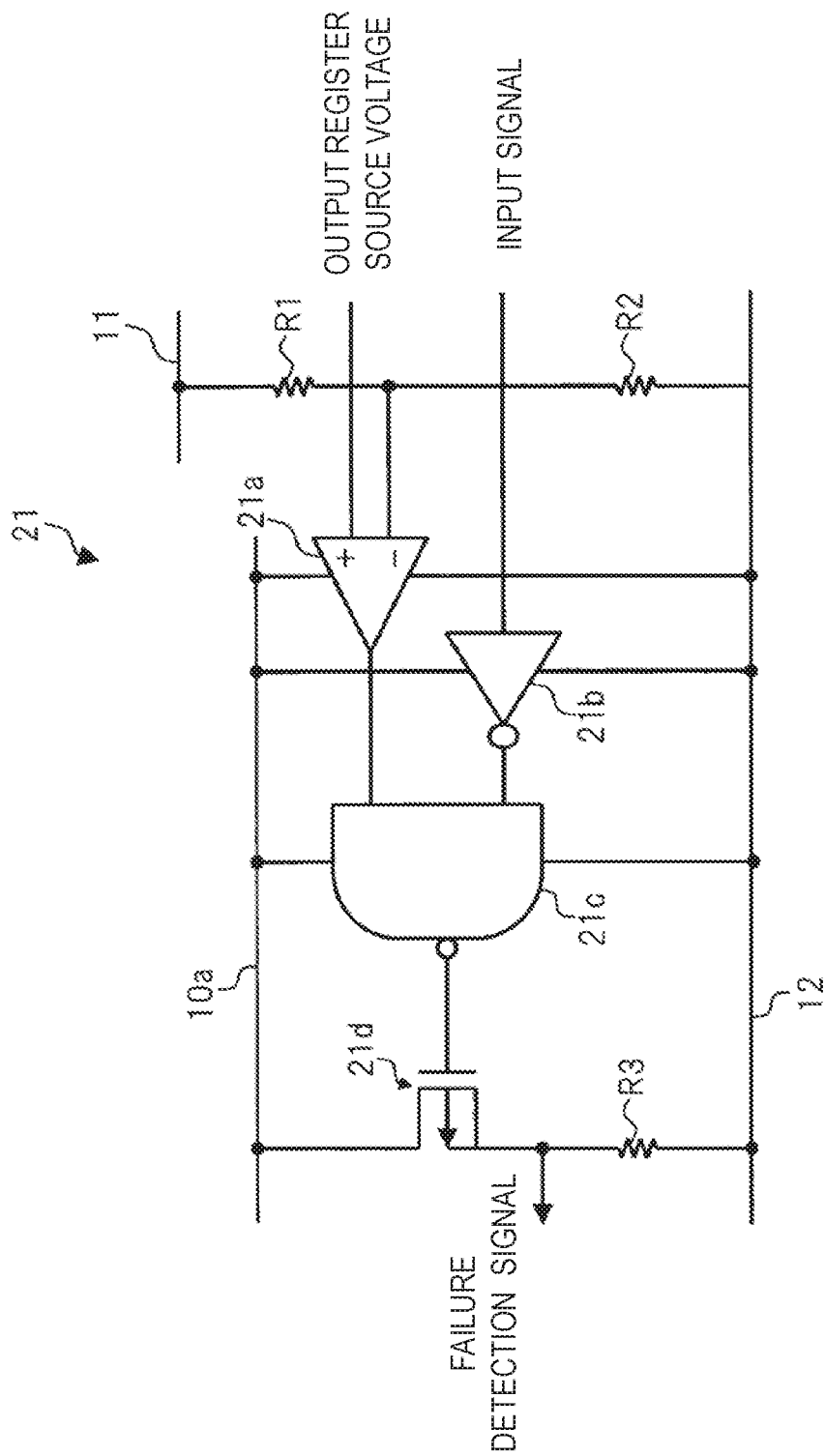
FIG. 3 is a circuit diagram showing a configuration example of a failure detection circuit according to the first embodiment.

An example of the configuration of the failure detection circuit 21 will be described. FIG. 3 is a circuit diagram showing an exemplary configuration of a failure detection circuit according to the present first embodiment. The failure detection circuit 21 shown in FIG. 3 includes resistive elements R1 to R3, comparators 21a, an inverting circuit 21b, a NAND circuit 21c, and a transistor 21d. The resistance elements R1 and R2 are connected in series between the power supply terminal 11 and the power supply terminal 12. The resistance elements R1 and R2 are elements for voltage division of the voltage between the power supply terminals 11 and 12. The abnormality detection threshold voltage is generated by the resistance elements R1 and R2. The node connecting the resistive element R1 and the resistive element R2 is connected to the negative terminal of the comparator 21a.

A predetermined voltage divided by the resistance elements R1 and R2 is applied to the negative terminal of the comparator 21a. This voltage is an abnormality detection threshold voltage for detecting the failure of the output transistor, and is set by the ratio of the resistance values of the resistance elements R1 and R2. For example, if the ratio of the resistance value of the resistive element R2 is reduced, the failure detection sensitivity can be improved. The positive terminal of the comparator 21a is connected to, for example, the source terminals of the output transistors A1 and B1, and the voltage of the source terminal (the voltage of the output terminal 13) is applied to the positive terminal. The output terminal of the comparator 21a is connected to the first input terminal of the NAND circuit 21c, and the comparator 21a outputs the comparison result of the voltages of the positive side terminal and the negative side terminal to the NAND circuit 21c. Specifically, when the voltage of the positive terminal is higher than the voltage of the negative terminal, the comparator 21a outputs a high-level signal. On the other hand, when the voltage of the negative terminal is higher than the voltage of the positive terminal, the comparator 21a outputs a low-level signal.

An input terminal of the inverter circuit 21b is connected to the microcomputer 3, and an input signal from the microcomputer 3 is input thereto. The output terminal of the inverter circuit 21b is connected to the second input terminal of the NAND circuit 21c and outputs the logic inverted input signal.

The NAND circuit 21c outputs predetermined signals based on the outputs of the comparators 21a and the inverters 21b. The output terminal of the NAND circuit 21c is connected to the gate terminal of the transistor 21d. The NAND circuit 21c outputs a low-level signal when a high-level signal is inputted from the comparators 21a and the inverters 21b, respectively, and outputs a high-level signal otherwise. That is, the NAND circuit 21c outputs a low-level signal when a failure of the output transistor is detected.

The transistor 21d is made of, for example, PMOSFET (Positive MOSFET). The source terminal of the transistor 21d is connected to the internal power supply terminal 10a. The drain terminal of the transistor 21d is connected to the power supply terminal 12 via the resistive element R3. When a high-level signal is input to the gate terminal of the transistor 21d, the transistor 21d is turned off, the drain terminal of the transistor 21d is pulled down to the power supply terminal 12, and the transistor 21d outputs a low-level failure detection signal. In this case, the failure detection circuit 21 notifies the fusing signal output circuit 23 and the abnormal signal output circuit 25 that the failure of the output transistor is not detected.

On the other hand, when a low-level signal is input to the gate terminal of the transistor 21d, the transistor 21d is turned on, and a high-level voltage is supplied from the internal power supply terminal 10a to the drain terminal. In this case, the transistor 21 d outputs a high-level failure detection signal, and notifies the fusing signal output circuit 23 and the abnormal signal output circuit 25 that the failure has been detected.

FIG. 4 is a table listing the operation of the failure detection circuit of FIG. 3. FIG. 4 shows the state (normal or failure) of the output transistor, the input signal from the microcomputer 3, the source voltage of the output transistor, the logic (determination result) of the failure detection circuit 21, and the failure detection signal.

First, a case where the output transistor is normal will be described. When both the input signal and the source voltage of the input transistor are at a high level, the failure detection circuit 21 determines that the output transistor is normal, and outputs a low-level failure detection signal. Also, when both the input signal and the source voltage of the input transistor are at a low level, the failure detection circuit 21 determines that the output transistor is normal, and outputs a failure detection signal at a low level.

Next, a case in which the output transistor is abnormal, i.e., a case in which a failure has occurred, will be described. When both the input signal and the source voltage of the input transistor are at a high level, the failure detection circuit 21 determines that the output transistor is normal, and outputs a low-level failure detection signal. In this case, the failed output transistor performs a correct operation and is determined to be normal. On the other hand, if the input signal is at a low level and the source voltage of the input transistor is at a high level, the failure detection circuit 21 determines that a failure has occurred in the output transistor and outputs a failure detection signal at a high level. That is, in the present embodiment, when the output transistor is in the off-state, the failure of the output transistor is detected.

The fusing signal output circuit 23 is a circuit for outputting a fusing signal for fusing the bonding wires BW1 to BWn when a failure of the output transistor is detected. The fusing signal outputting circuit 23 is connected to the gate driving circuits 15-1 to 15-n, and sequentially outputs fusing signals F 1 to Fn for fusing the bonding wires BW1 to BWn to the corresponding gate driving circuits 15-1 to 15-n at the time of failure detection. When the fusing signals F 1 to Fn are input, the gate drive circuits 15-1 to 15-n turn on the corresponding output transistors via the gate separation circuits 17-1 to 17-n. The period during which the output transistor is driven is defined by a timer circuit (not shown) or the like.

The abnormal signal output circuit 25 is connected to the microcomputer 3, the wire fusing detection circuit 27, and the like. When the failure detection signal is output from the failure detection circuit 21, the failure signal output circuit 25 outputs a failure signal for notifying the microcomputer 3, the wire fusing detection circuit 27, and the gate drive circuits 15-1 to 15-n that the failure of the output transistor has been detected. For example, the abnormality signal output circuit 25 outputs an abnormality signal of a low level when a failure is not detected, and outputs an abnormality signal of a high level when a failure is detected.

The wire fusing detection circuit 27 is a functional block for detecting the fusing of the bonding wire in the wire fusing process performed at the time of detecting the failure. The input side of the wire fusing detection circuit 27 is connected to the output terminal 13 and the abnormal signal output circuit. The output side of the wire fusing detection circuit 27 is connected to the fusing signal output circuit 23. The wire fusing detection circuit 27, upon sensing the fusing of the bonding wire, outputs a predetermined fusing detection signal FD1-FDn to the fusing signal output circuit 23.

Figure 5:
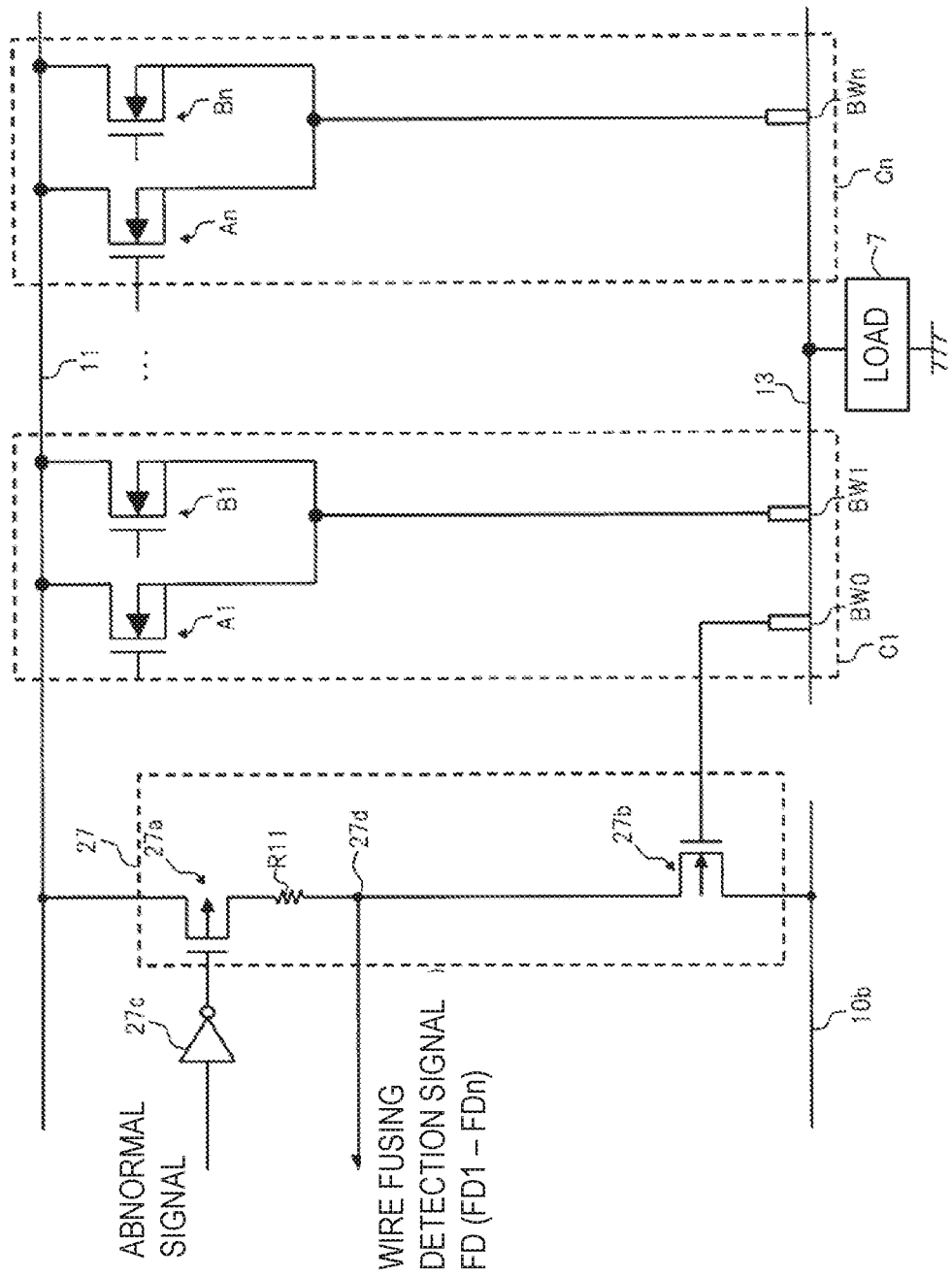
FIG. 5 is a circuit diagram showing a configuration example of a wire dissolution detection circuit according to the first embodiment.

FIG. 5 is a circuit diagram showing an exemplary configuration of a wire fusing detection circuit according to the present first embodiment. FIG. 5 shows an output transistor, a load 7, a power supply terminal 11, an output terminal 13, and the like in addition to the wire fusing detection circuit 27. The wire fusing detection circuit 27 includes transistors 27a and 27b and a resistive element R11. The transistor 27a is formed of, for example, a PMOSFET, and the transistor 27b is formed of, for example, a NMOSFET.

The source terminal of the transistor 27a is connected to the power supply terminal 11, and the drain terminal of the transistor 27b is connected to the drain terminal of the transistor 27b via the resistive element R11. The resistive element R11 is provided between the transistor 27a and the output terminal 27d of the wire fusing detection circuit 27. The gate terminal of the transistor 27a is connected to the output terminal 13 of the inverter circuit 27c. An input terminal of the inverter circuit 27c is connected to the abnormal signal output circuit 25. Therefore, the logically inverted abnormal signal is input to the gate terminal of the transistor 27a. The source terminal of the transistor 27b is connected to the internal power supply 10b. The gate terminal of the transistor 27b is connected to the output terminal 13 through a bonding wire BW0.

An outline of the operation of the wire fusing detection circuit 27 at the time of fusing the bonding wire will be described. The inverter circuit 27c outputs a logic-inverted low-level signal when a high-level abnormal signal is input. As a result, the transistor 27a is turned on. Further, at the time of executing the wire fusing process, the output transistors corresponding to the fusing signals F(F1 to Fn) are turned on, and the voltage of the output terminal 13 becomes high level, so that the transistor 27b is also turned on. At this time, since the resistive element R11 divides the voltage between the power supply terminal 11 and the output terminal 13 by the resistive element R11, the wire fusing detection circuit 27 outputs corresponding low-level wire fusing detection signals FD (FD1 to FDn).

When the bonding wire is fused, the voltage at the output terminal 13 is pulled out to the low level through the load 7, and the transistor 27b is turned off. As a result, the wire fusing detection circuit 27 outputs a high-level wire fusing detection signal. As a result, the fuse signal output circuit 23 is notified that the bonding wire has been fused.

Figure 6:
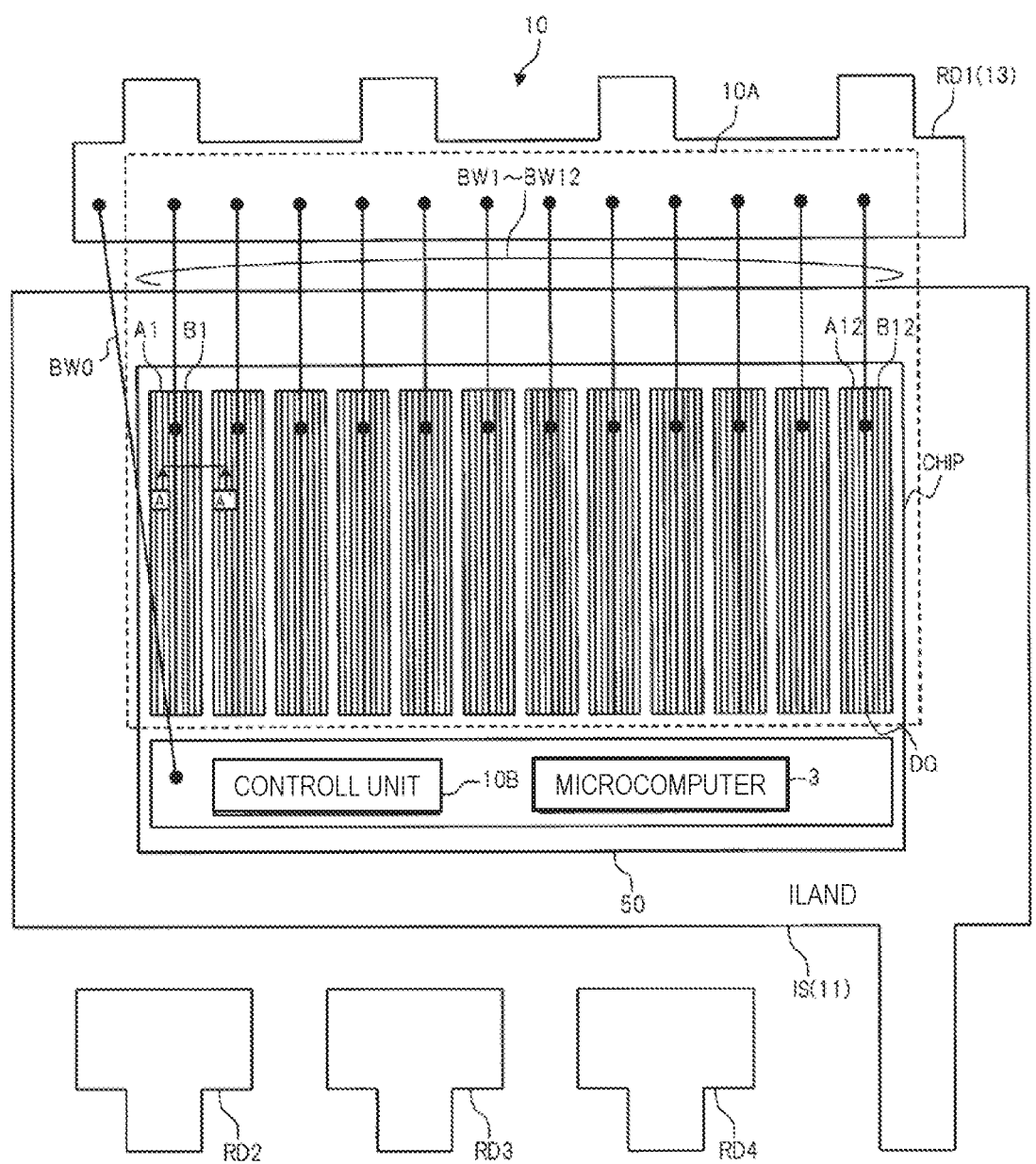
FIG. 6 is a diagram illustrating an exemplary package of a semiconductor device according to the first embodiment.

Here, the semiconductor device package will be described. FIG. 6 is a diagram showing an exemplary package of the semiconductor device according to the present first embodiment. The power control device 10 according to the present embodiment is realized as an 8-pin SOP (Small Outline Package) package, for example, but is not limited to this package.

The power control device 10 shown in FIG. 6 includes, for example, a semiconductor chip CHIP, a lead frame RD1 to RD4, an island IS of the lead frame, and the like. The semiconductor chip CHIP is composed of a semiconductor substrate, and the semiconductor chip is mounted on the island part. The power output unit 10A of the power control device 10 and the control circuit 50 are formed on the semiconductor chip CHIP. The control circuit 50 may include the control unit 10B and the microcomputer 3, or may not include the microcomputer 3.

The power output unit 10A shown in FIG. 6 is provided with a plurality of (24) output transistors A1, B1 to A12, and B12. The output transistors A1, B1 to A12, and B12 are arranged in a row in the lateral direction in the drawing. The output transistors A1, B1 to A12, and B12 are connected to the lead frame RD1 via bonding wires BW1 to BW12. The control unit 10B is connected to the lead frame RD1 via a bonding wire BW0. Therefore, the island part IS also serves as the power supply terminal 11, and the lead frame RD1 also serves as the output terminal 13.

Figure 7:
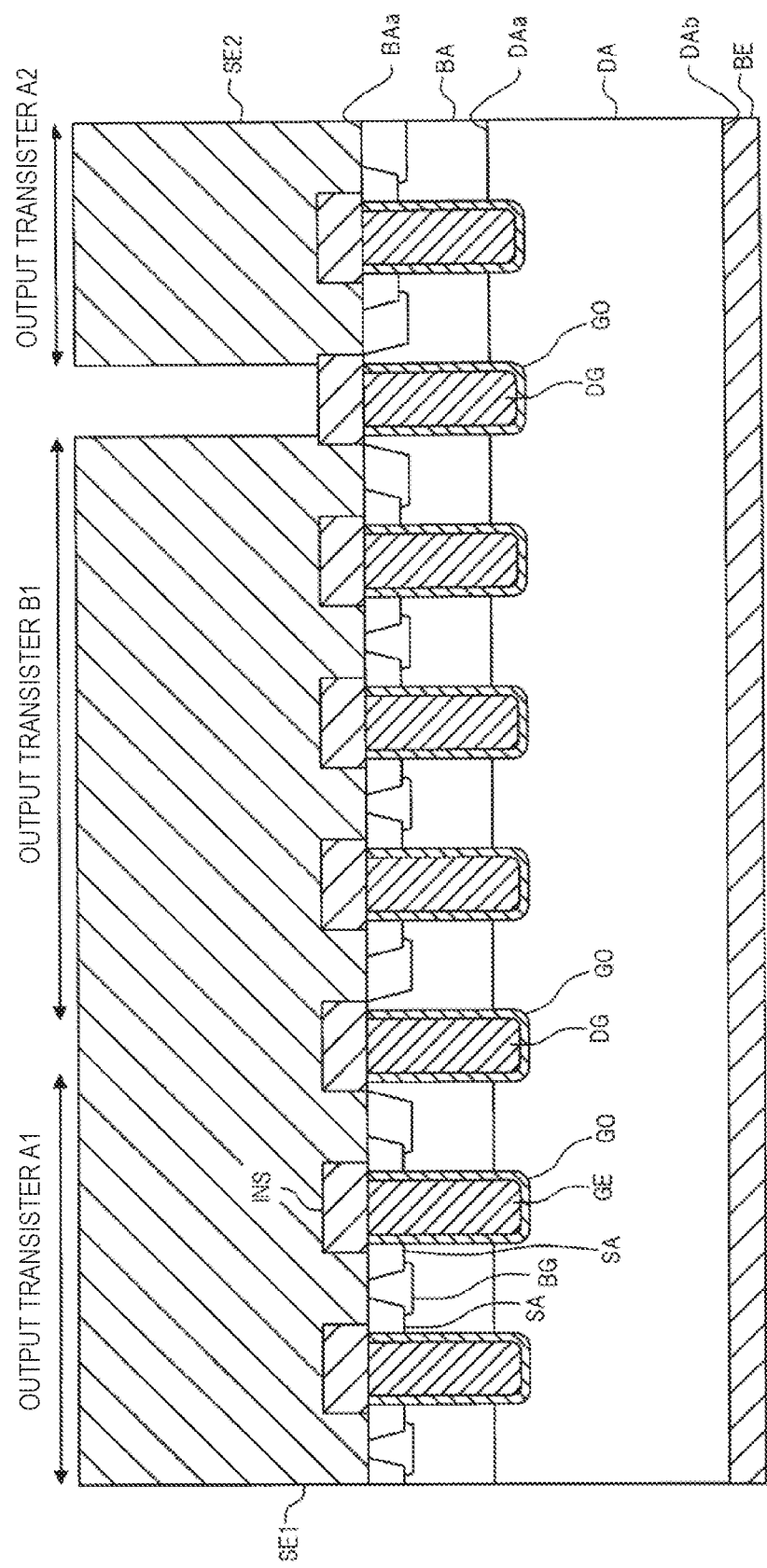
FIG. 7 is a partial cross-sectional view of the output transistor shown in FIG. 6.

Next, the cross-sectional structure of the output transistor will be described. FIG. 7 is a portion cross-sectional view of the outputting transistor shown in FIG. 6. FIG. 7 shows a cross-sectional view including the output transistors A1, B1, and A2. Note that the outputting transistor of FIG. 7 is a MOSFET. The semiconductor substrate in the vicinity of the output transistor includes a drain region DA, a base region BA, a plurality of gate electrodes GE, a plurality of back gate contact regions BG, a plurality of source regions SA, and the like.

The base region BA is provided on the main surface DAa of the drain region DA. Each of the gate electrodes GE is buried in semiconductor substrate so that the gate electrodes GE reach the drain region DA from the main surface BAa of the base region BA. On the other hand, the upper end of the gate electrode GE substantially coincides with the main surface BAa of the base region BA. The gate electrode GE is formed in the vertical direction over the entire area of the output transistor in FIG. 6. Therefore, each of the gate electrodes GE has a trench structure for dividing the base region BA between the gate electrodes GE and the adjacent gate electrodes GE. A dummy gate DG is provided between the adjacent output transistors A1, B1, and A2. Like the gate electrodes GE, the dummy gate DG has a trench structure, and the dummy gate DG is buried in semiconductor substrate so as to reach the drain region DA from the main surface BAa of the base region BA.

An insulating layer INS is provided on the main surface BAa of the base region BA so as to cover the upper ends of the gate electrode GE and the dummy gate DG. The insulating layer INS prevents contact between the gate electrode GE, the dummy gate DG, and a source electrode to be described later. Each of the gate electrodes GE and the dummy gates DG is covered with a gate oxide film GO except for the upper end side.

The back gate contact region BG is provided on the main surface BAa side of the base region BA in a central portion of a region between adjacent gate electrodes GE. The source region SA is provided in a region between the back gate contact region BG and the gate electrode GE. However, the source region SA is not provided around the dummy gate DG.

Source electrodes SE1,SE2 are provided on the main surface BAa of the base region BA. The source electrodes SE1,SE2 are in contact with the back gate contact regions BG and the source regions SA. The potential of the dummy gate is the same as that of the source electrode of one of the adjacent output transistors. A back electrode BE is provided on the back surface DAb of the drain region DA.

Figure 8:
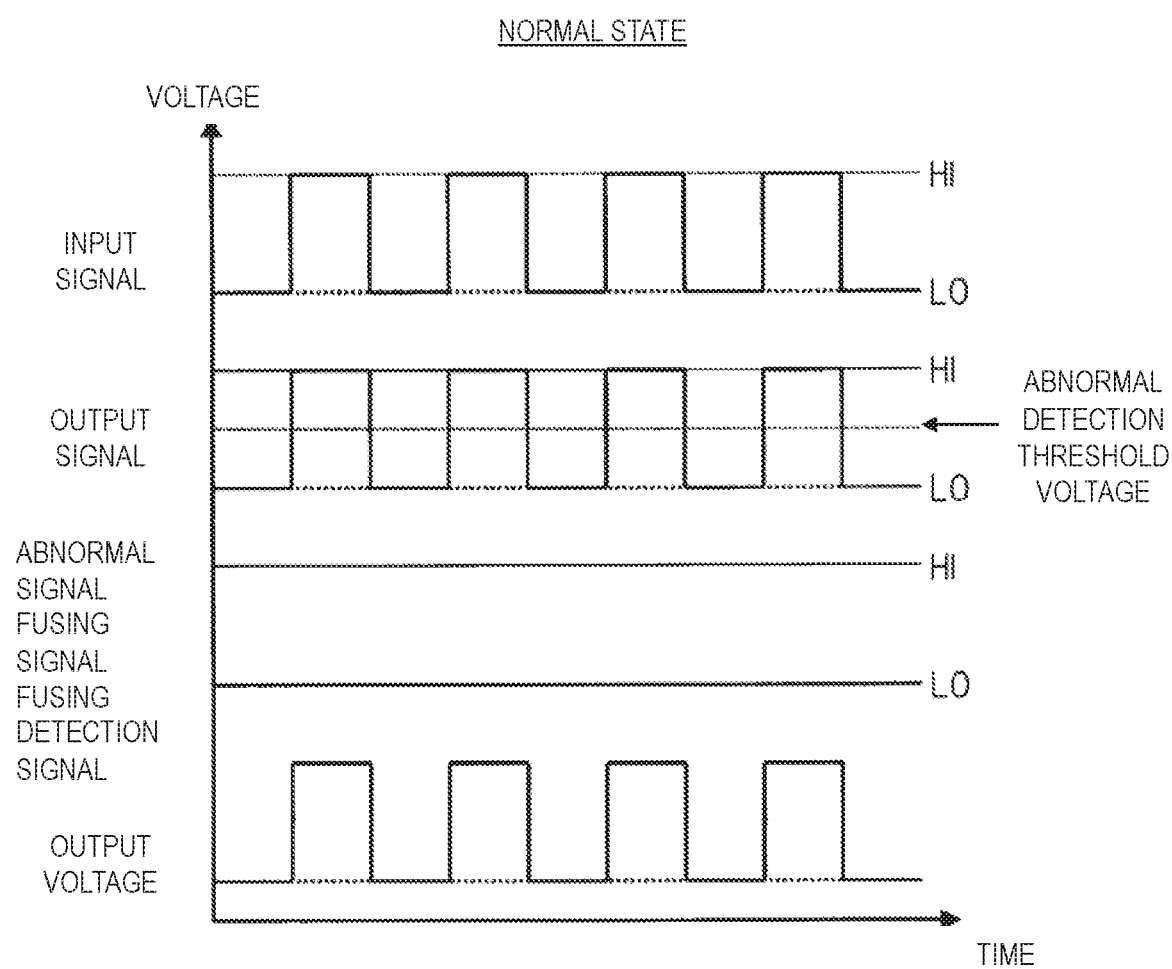
FIG. 8 is a timing chart explaining normal operation.

Before describing the operation at the time of failure detection, the operation at the time of normal will be described. FIG. 8 is a timing chart for explaining the normal operation. FIG. 8 shows an input signal, an output signal (output terminal 13), an abnormality signal, a fusing signal, a voltage of a fusing detection signal, and an output current, respectively.

As shown in FIG. 8, the input signal is a signal that alternately repeats a low level (LO) and a high level (HI). When the input signal is at a low level, the output transistors A1, B1 to An and Bn are turned off, and the output signal is at a low level. On the other hand, when the input signal is at a high level, the output transistors A1, B1 to An and Bn are turned on, and the output signal is at a high level. In this manner, the output signal repeats a low level and a high level in accordance with the level of the input signal. When the output signal is at the high level, the output current supplied to the load 7 becomes large, and when the output signal is at the low level, the output current becomes small.

Figure 9:
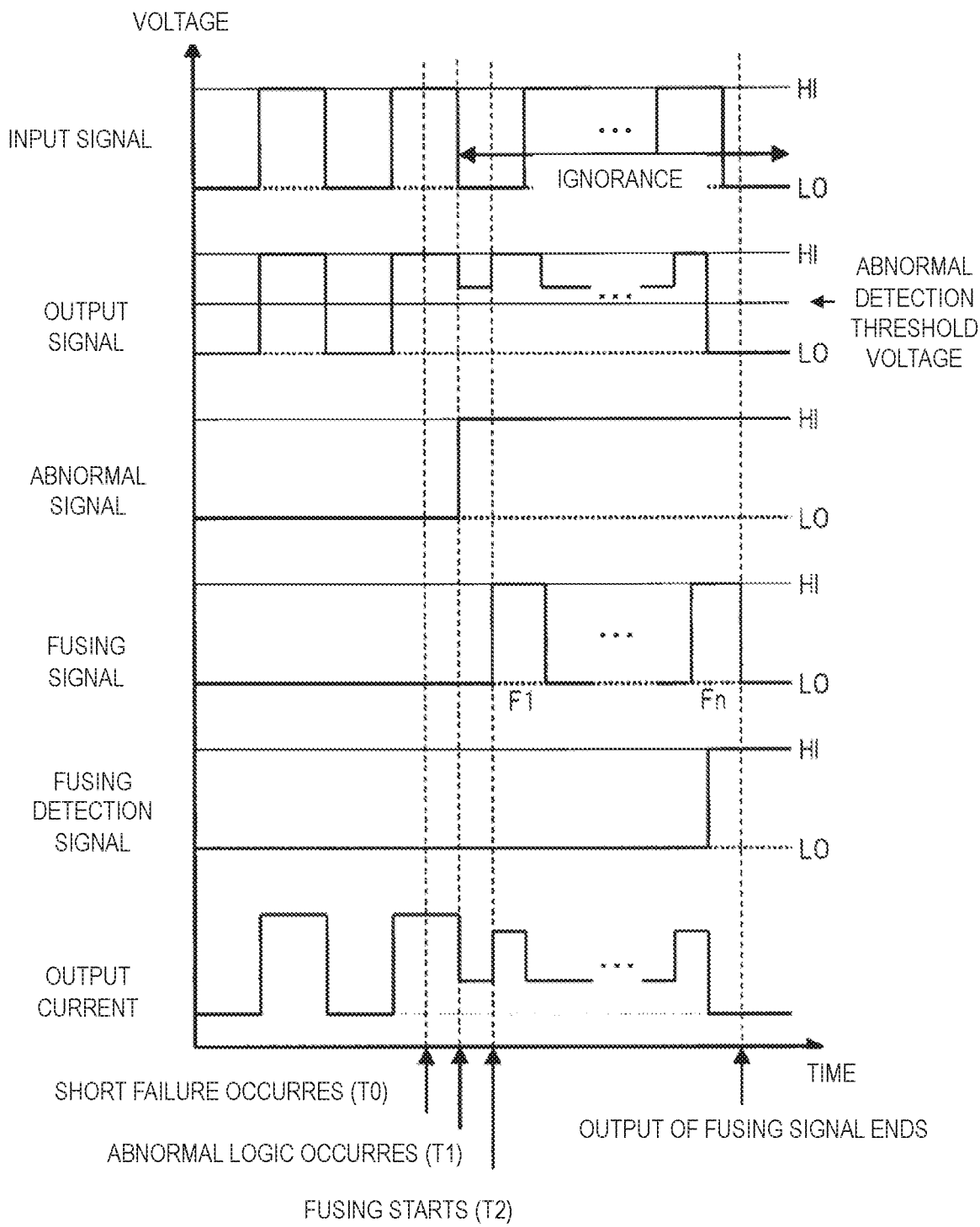
FIG. 9 is a timing chart explaining the operation when a failure is detected.
Figure 10:
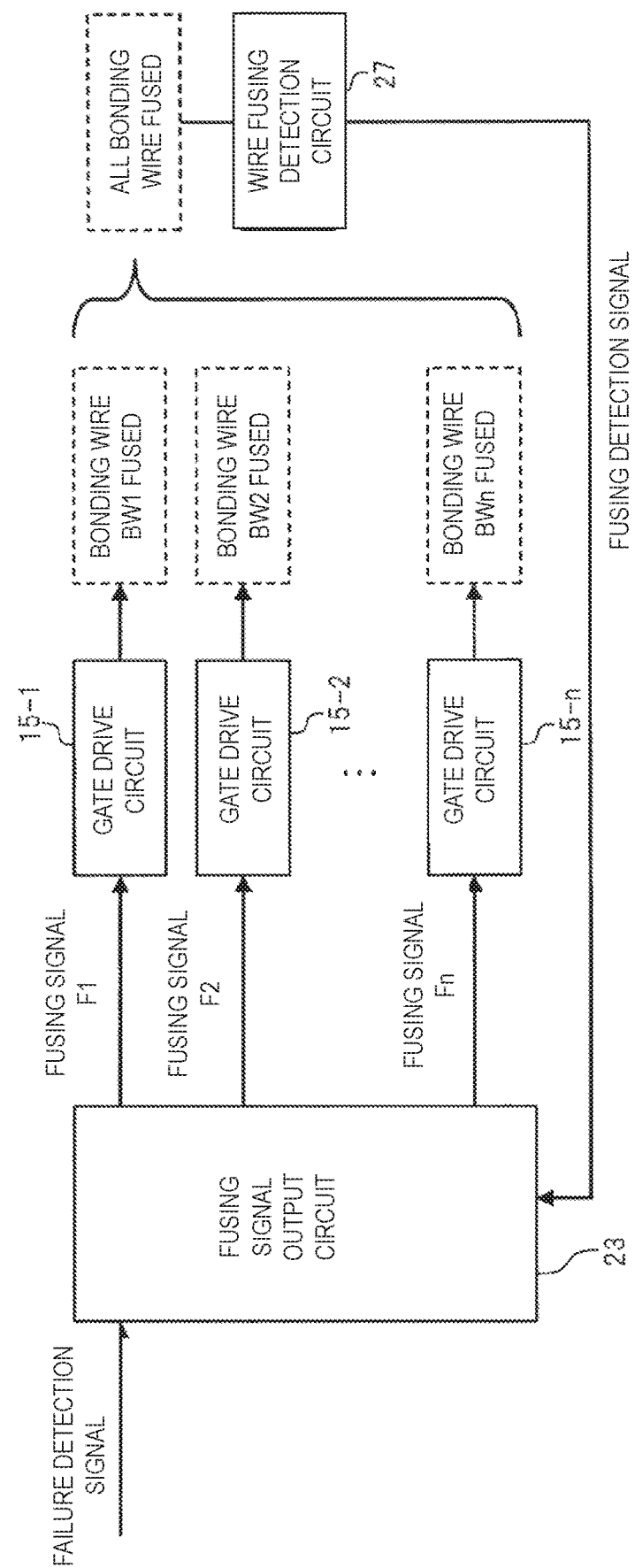
FIG. 10 is an explanation diagram of a wire welding process.

FIG. 9 is a timing chart for explaining the operation at the time of failure detection. FIG. 9 also shows an input signal, an output signal (output terminal 13), an abnormality signal, a fusing signal, a voltage of a fusing detection signal, and an output current. FIG. 9 shows a case where any of the output transistors An and Bn of the unit C1 fails. FIG. 10 is an explanatory view of the wire fusing process.

In FIG. 9, a failure occurs at time T0 when the output transistor is in the on state. However, here, since no abnormal logic occurs, no failure is detected. At time T1, the input signal is switched from the high level to the low level. However, although the output signal slightly drops from the high-level voltage before failure detection, it is at a level higher than the abnormality detection threshold voltage. Therefore, since the abnormal logic occurs at time T1, the failure of the output transistor is detected by the failure detection circuit 21, and the occurrence of the failure is notified to the fusing signal output circuit 23 and the abnormal signal output circuit 25. Then, the abnormality signal is switched from the low level to the high level, and the failure detection is also notified to the wire fusing detection circuit 27.

The notification of the failure detection to the gate drive circuits 15-1 to 15-n may be performed by, for example, the above-described failure detection signal or abnormality signal, or may be performed by other signals. When the failure detection is notified, the gate drive circuits 15-1 to 15-n ignore the input signal output from the microcomputer 3. Then, the fusing signal output circuit 23 sequentially performs a wire fusing process for outputting a fusing signal for turning on only the output transistor of one unit to the corresponding gate driving circuit for all the output transistor driving circuits.

First, the fusing-signal outputting circuit 23 performs a wire fusing process on the bonding wire BW1. The fusing signal output circuit 23 outputs the fusing signal F1 to the gate driving circuit 15-1 at time T2, and turns on the output transistors A 1 and B 1 of the unit C1. On the other hand, the output transistors A2, B2 to An, Bn of the other units C2 to Cn are in an off state. Then, since the power supply terminal 11 and the output terminal 13 are connected to each other only through the unit C1 except for the failure output transistor, the current concentrates on the unit C1. In this manner, the gate driver 15-1 can control the output of the output transistor so that a current larger than that at the time of failure non-detection flows through the bonding wire BW1.

While the fusing signal F1 is being outputted, the bonding wire BW1 is fused. However, since it is assumed here that the output transistor of the unit Cn has failed, a current continues to flow through the failed output transistor. When the predetermined period has elapsed, the fusing signal output circuit 23 stops the output of the fusing signal F1, and ends the wire fusing process for the bonding wire BW1.

Subsequently, the fusing signal output circuit 23 sequentially outputs the fusing signals F2 to Fn to the gate driving circuits 15-2 to 15-n, thereby sequentially performing the wire fusing process on the bonding wires BW2 to BWn. The order in which the wire fusing process is performed is not limited to this.

In the wire fusing process for the bonding wire BWn, when the bonding wire BWn is fused, all of the bonding wires are fused, so that the output current becomes almost zero. As a result, as shown in FIG. 10, the wire fusing detection circuit 27 recognizes that all the bonding wires have been fused, outputs a high-level fusing detection signal, and notifies the fusing signal output circuit 23 of the same.

When the wire fusing detection circuit 27 cannot detect the fusing of the bonding wire after the wire fusing treatment in the last unit Cn is completed, it determines that there remains a bonding wire that has not been fused, and outputs a low-level signal. In this case, the fusing signal output circuit 23 sets the ON time of the output transistor longer than the previous bonding wire fusing process. Then, each of the gate driving circuits 15-1 to 15-n performs the bonding wire fusing process again on the basis of the long ON time. For example, the on-time of the second wire fusing process is set to twice the on-time of the first time, and the on-time of the third wire fusing process is set to three times the on-time of the first time. In this manner, the on-time of each time is set to an integer multiple of the on-time of the first time.

Modified Example

The fusing signal output circuit 23 may determine whether or not to perform the wire fusing processing again based on the fusing detection signals FD1 to FDn output for each wire fusing processing. For example, in the case where an output transistor other than the unit Cn has failed, when a bonding wire connected to the failed output transistor is fused, a fusing detection signal of a high level is output. Then, in the subsequent wire fusing processing, it becomes possible to determine whether or not the individual bonding wires have been fused. Therefore, in the wire fusing process performed after the first high-level fusing detection signal is output, if the fusing of the bonding wire is not detected in some cases, it is determined that there remains an unfused bonding wire, and the fusing signal output circuit 23 performs the wire fusing process for the second and subsequent times. As a result, the bonding wire connected to the normal output transistor can also be reliably fused and cut.

According to present embodiment, when a failure of an output transistor is detected, the output transistor is driven for each unit, and a current larger than that at the time of failure non-detection flows through the bonding wire. According to this configuration, since the bonding wire connected to the failed output transistor can be cut off, the current path of the failed output transistor can be reliably cut off. This can also prevent burning of the semiconductor device.

According to the present embodiment, the wire fusing process is sequentially performed on all the bonding wires. According to this configuration, when the failure of the output transistor is detected, all of the bonding wires are fused, so that all of the current paths including the semiconductor device in which the failure has occurred can be reliably disconnected.

Further, according to the present embodiment, when the fuse of the bonding wire cannot be detected after the wire fuse process in the last unit is completed, the on-time of the outputting transistor is set to be long, and the wire fuse process is performed again. According to this configuration, it is possible to perform the fusing of the bonding wire more reliably.

According to the present embodiment, each of the units C1 to Cn includes a plurality of output transistors, and these output transistors are connected in parallel. According to this configuration, it is possible to increase the current at the time of the wire fusing process, so that it is possible to reliably fuse the bonding wire. In addition, the ON period of the output transistor at the time of the wire fusing process can be shortened, and the time required for the wire fusing process can be shortened. In addition, even if the current supply capability of the output transistor is lowered due to a failure, it is possible to secure a current necessary for fusing.

Next, second embodiment will be described. In first embodiment, the failure of the output transistor is detected when the semiconductor device is in the off state, but the failure of the output transistor is not detected when the semiconductor device is in the on state. Therefore, present embodiment describes a semiconductor device in which a failure can be detected even when the semiconductor device is on.

FIG. 11 is a diagram illustrating a configuration example of a semiconductor device including a power control device and a configuration example of a power control system including a semiconductor device according to the present second embodiment. As shown in FIG. 11, the power control system according to the present embodiment includes a semiconductor device 101, semiconductor device 501A, 501B, and the like.

The semiconductor device 101 includes a microcomputer 103 and a power control device 110. Like the first embodiment, the power control device 110 has a fuse function capable of fusing a bonding wire when a failure is detected. An input terminal of the power control device 110 is connected to the battery 5, and the input terminal supplies power supplied from the battery 5 to the downstream-side semiconductor device 501A, 501B. Thus, in the power control systems of FIG. 11, the power control device 110 is a higher-level unit and the semiconductor device 501A, 501B is a lower-level unit. In FIG. 11, although semiconductor device 501A and 501B are shown as the lower units, more lower units may be provided.

The semiconductor device 501A, 501B include microcomputers 503A, 503B and power control device 510A, 510B, respectively. The inputs of the power control device 510A, 510B are connected to the outputs of the power control unit 110 via lines N1. Outputs of the power control device 510A and 510B are connected to the loads 7A, 7B, respectively. The semiconductor device 501A, 501B supply electric power supplied from the semiconductor device 101 of the host unit to the respective loads 7A, 7B. The power control device 510A, 510B of the lower unit may be a typical IPD, a power MOSFET, an IGBT, or the like without a fuse function, or may be a power control device having a fuse function.

Thus, the semiconductor device 101 of FIG. 11 functions as relays. Generally, a fail-safe fuse is provided between the battery and the relay. However, in the present embodiment, since the power control device 110 has a fuse function, a fuse between the battery and the relays can be omitted. As a result, the number of components such as wire harnesses can be reduced, and the weight of the semiconductor device 101 can be reduced.

Figure 12:
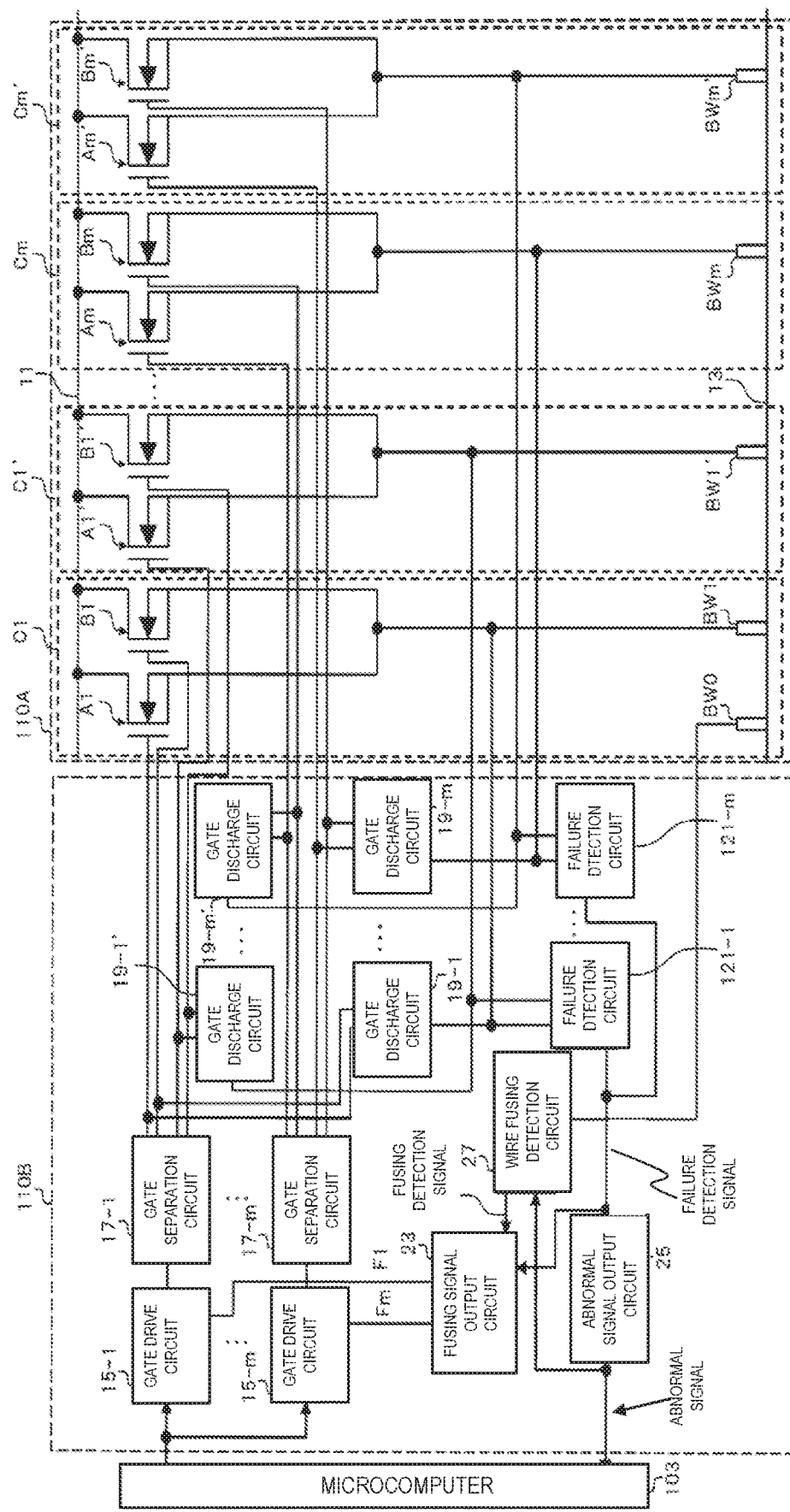
FIG. 12 is a circuit diagram showing an exemplary configuration of a semiconductor device according to the second embodiment.

FIG. 12 is a circuit diagram showing an exemplary configuration of a power control device according to the present second embodiment. The microcomputer 103 is also shown in FIG. 12. As shown in FIG. 12, the power control device 110 includes a power outputting unit 110A and a control unit 110B. The power output unit 110A includes a power supply terminal 11, an output terminal 13, and output transistors A1 to Am, B1 to Bm, A1' to Am', and B1' to Bm'.

The control unit 10 B includes gate drive circuits (output transistor drive circuits) 15-1 to 15-$m$, gate isolation circuits 17-1 to 17-$m$, gate discharge circuits 19-1 to 19-$m$, 19-1' to 19-$m$', failure detection circuits 121 (121-1 to 121-$m$), a fusing signal output circuit 23, an abnormal signal output circuit 25, and a wire fusing detection circuit 27.

Among the output transistors A1 to Am, B1 to Bm, A1' to Am', and B1' to Bm', the output transistors A1, B1 to Am, Bm, A1', B1' to Am', and Bm' are respectively included as a pair of transistors in the same units C1 to Cm, C1' to Cm'. The output transistors A1, B1 to Am, Bm, A1', B1' to Am' and Bm' are connected in parallel between the power supply terminal 11 and the output terminal 13.

The drain terminals of the output transistors A1, B1 to Am, Bm, A1', B1' to Am' and Bm' are connected to the power supply terminal 11, and power is supplied from the battery 5 via the power supply terminal 11.

Source terminals of the output transistors A1, B1 to Am, Bm, A1', B1' to Am' and Bm' are connected to the output terminal 13 via corresponding bonding wires BW1 to BWm and BW1' to BWm', respectively. As described above, the power output unit 110A includes a plurality of units each including a bonding wire and a corresponding plurality of output transistors.

The gate terminals of the output transistors A1, B1 to Am, Bm are connected to the gate isolation circuits 17-1 to 17-$m$ corresponding to the units C1 to Cm, respectively. The gate terminals of the output transistors A1', B1' to Am', and Bm' are connected to the gate isolation circuits 17-1 to 17-$m$ corresponding to the units C1' to Cm', respectively. That is, the gate isolation circuit 17-1 corresponds to the units C1 and C1'. Similarly, the subsequent gate isolation circuits 17-2 to 17-$m$ correspond to the units C2, C2 to Cm, and Cm', respectively. The output transistors A1, B1, A1', B1' to Am, Bm, Am', and Bm' are switched on and off based on the gate signals output from the gate isolation circuits 17-1 to 17-$m$.

The gate drive circuits 15-1 to 15-$m$ are circuits for controlling the operation of the corresponding output transistors A1, B1, A1', B1' to Am, Bm, Am', and Bm'. The gate drive circuits 15-1 to 15-$m$ are connected to the microcomputer 103 and the corresponding gate isolation circuits 17-1 to 17-$m$, respectively. The gate drive circuits 15-1 to 15-$m$ output predetermined signals based on input signals output from the microcomputer 103 to the gate separation circuits 17-1 to 17-$m$.

The gate drive circuits 15-1 to 15-$m$ are also connected to the fusing signal output circuit 23. When the failure of the output transistor is detected, the gate drive circuits 15-1 to 15-$m$ ignore the input signal and control the operation of the output transistors A1, B1 to An, and Bn based on the fusing signal output from the fusing signal output circuit 23.

The gate separation circuits 17-1 to 17-$m$ output gate signals to the corresponding output transistors based on the signals output from the corresponding gate drive circuits 15-1 to 15-$m$. When signals for operating the power output unit 110 A are output from the corresponding gate drive circuits 15-1 to 15-$m$, the gate isolation circuits 17-1 to 17-$m$ output gate signals for turning on the corresponding output transistors A1, B1, A1', B' to Am, Bm, Am', and Bm', respectively.

The gate discharge circuits 19-1 to 19-m and 19-1' to 19-m' are connected to the gate and drain terminals of the output transistors A1, B1 to Am, Bm, A1', B1' to Am' and Bm' of the corresponding units C1 to Cm and C1' to Cm' respectively.

As shown in FIG. 12, the input sides of the failure detection circuits 121-1 to 121-m are connected to the microcomputer 103 and the source terminals of the corresponding output transistors A1, B1, A1', B1 to Am, Bm, Am', and Bm', respectively. The output sides of the failure detection circuits 121-1 to 121-m are connected to the fusing signal output circuit 23 and the abnormal signal output circuit 25, respectively.

Figure 13:
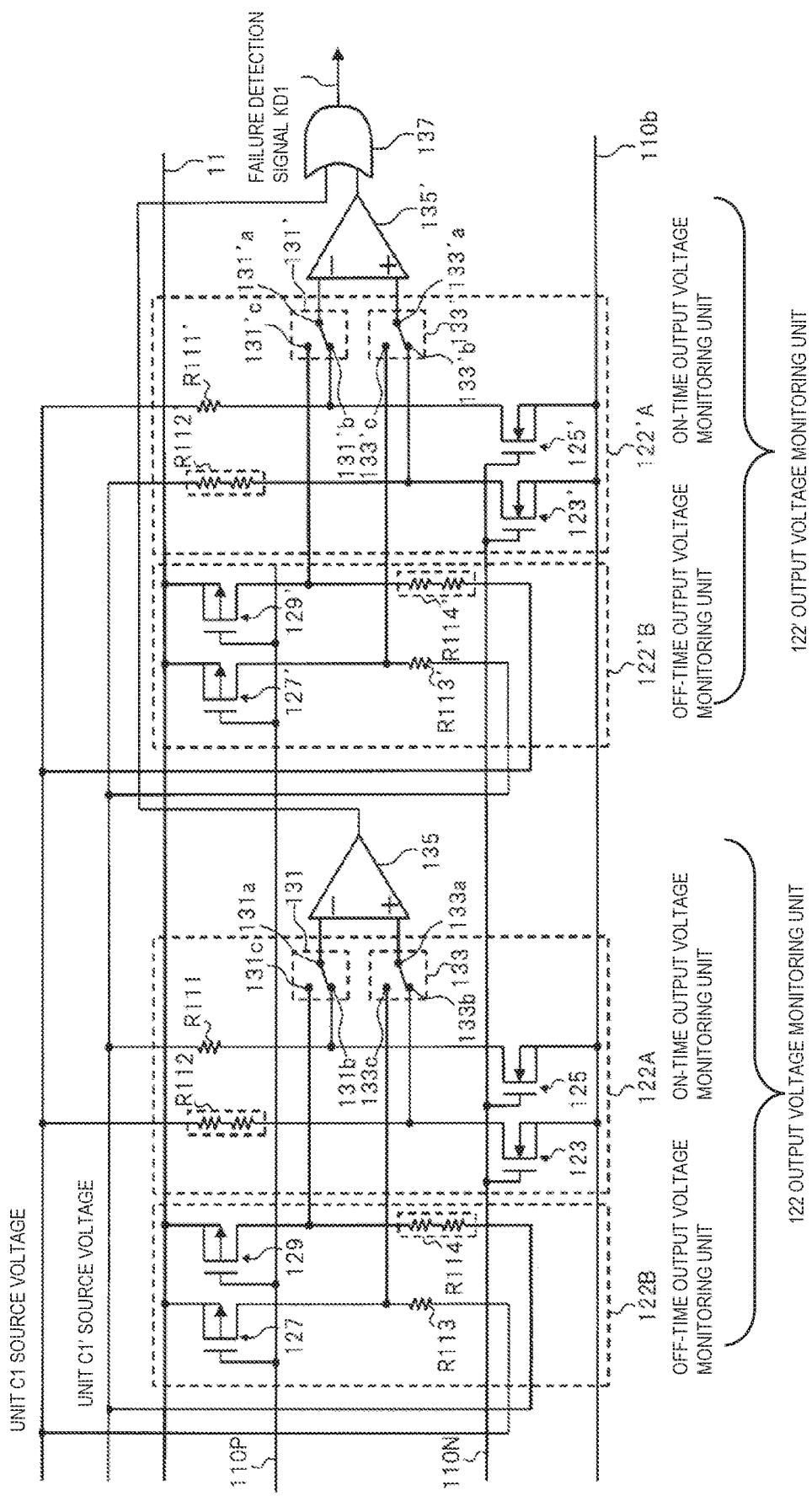
FIG. 13 is a circuit diagram illustrating an exemplary failure detection circuit according to the second embodiment.

FIG. 13 is a circuit diagram showing an exemplary failure detection circuit according to the second embodiment. The failure detection circuits 121-1 to 121-m have the same basic configuration, except that the corresponding units are different from each other. Therefore, the configuration of the failure detection circuit will be described below by taking the failure detection circuit 121-1 as an example.

The failure detection circuit 121-1 is provided corresponding to the pair of units C1 and C1', and detects a failure of the output transistor included in the units C1 and C1' by comparing the source voltages of the units C1 and C1'. Similarly, the failure detection circuits 121-2 to 121-m are provided corresponding to the pair of units C2, C2' to Cm, and Cm', respectively.

As shown in FIG. 13, the failure detection circuit 121-1 includes an output voltage monitoring unit 122 corresponding to the unit C1, an output voltage monitoring unit 122' corresponding to the unit C1', and the like. The output voltage monitoring unit 122 includes an on-time output voltage monitoring unit 122A, an off-time output voltage monitoring unit 122B, switches 131 and 133, and a comparator 135. The output voltage monitoring unit 122' includes an on-time output voltage monitoring unit 122' A, an off-time output voltage monitoring unit 122' B, switches 131' and 133', and a comparator 135' The on-time output voltage monitoring units 122A and 122' A are functional blocks for monitoring the source voltages of the units C1 and C1' when the power control device 110 is on. The off-state output-voltage monitoring units 122B and 122' B are functional blocks for monitoring the source voltages of the units C1 and C1' when the power control device 110 is off.

The on-state output-voltage monitoring unit 122A includes a resistor R111,R112 and constant-current transistors 123 and 125. One terminal of the resistor R111 is connected to the source terminal of the output transistor included in the unit C1'. The other terminal of the resistor R111 is connected to the drain terminal of the constant current transistor 125. The other terminal of the resistor R111 is also connected to the first input terminal 131b of the switch 131.

One terminal of the resistor R112 is connected to the source terminal of the output transistor included in the unit C1. The other terminal of the resistor R112 is connected to the drain terminal of the constant current transistor 123. The other terminal of the resistor R112 is also connected to the first input terminal 133b of the switch 133.

The resistance value of the resistance element R111 is set to a value smaller than the resistance value of the resistance element R112, for example, about ½. The resistance value of the resistor R111 is such that the magnitude relation of the voltages at the first input terminals 131b and 133b of the switches 131 and 133 is not inverted even if a difference occurs in the source voltage between the units C1 and C1' in a normal state. Further, the resistance value of the resistive elements R111 is such a value that the magnitude relation of the voltages at the first input terminals 131b and 133b of the switches 131 and 133 is surely inverted when a failure occurs.

Source terminals of the constant current transistors 123 and 125 are connected to the internal power supply terminal 110b. The gate terminals of the constant current transistors 123 and 125 are connected to the constant current terminal 110N. A predetermined voltage, e.g., a 7 V voltage, is applied to the internal power supply terminal 110b. The constant current transistors 123 and 125 are formed of, for example, a NMOSFET.

The constant current transistors 123 and 125 allow a predetermined constant current to flow between the source and the drain based on a signal supplied from the constant current terminal 110N.

The off-state output-voltage monitoring unit 122B includes a resistor R113,R114 and constant-current transistors 127 and 129. One end of the resistor R113 is connected to the source terminal of the output transistor included in the unit C1. The other terminal of the resistor R113 is connected to the drain terminal of the constant current transistor 127. The other terminal of the resistor R113 is also connected to the second input terminal 133c of the switch 133.

One terminal of the resistor R114 is connected to the source terminal of the output transistor included in the unit C1'. The other terminal of the resistor R114 is connected to the drain terminal of the constant current transistor 129. The other terminal of the resistor R114 is also connected to the second input terminal 131 c of the switch 131.

The resistance value of the resistance element R113 is set to a value smaller than the resistance value of the resistance element R114, for example, about ½. The resistance value of the resistor R113 is such that the magnitude relation of the voltages at the second input terminals 131c and 133c of the switches 131 and 133 is not inverted even if a difference occurs in the source voltage between the units C1 and C1' in a normal state. Further, the resistance value of the resistive elements R113 is such a value that the magnitude relation of the voltages at the second input terminals 131c and 133 c of the switches 131 and 133 is surely inverted when a failure occurs.

Source terminals of the constant current transistors 127 and 129 are connected to the power supply terminal 11. The gate terminals of the constant current transistors 127 and 129 are connected to the constant current terminal 110P. The power supply terminal 11 is connected to the battery 5, and a predetermined voltage, for example, 13 V, is applied to the power supply terminal 11. The constant current transistors 127 and 129 are formed of, for example, a PMOSFET. The constant current transistors 127 and 129 allow a predetermined constant current to flow between the source and the drain based on a signal supplied from the constant current terminal 110P.

The output terminal 131 a of the switch 131 is connected to the negative terminal of the comparator 135. The output terminal 133a of the switch 133 is connected to the positive terminal of the comparator 135. The switches 131 and 133 are, for example, analog switches. The switch 131 switches the input terminals connected to the output terminals 131a and 133a by, for example, interlocking with an input signal output from the microcomputer 103.

As shown in FIG. 13, since the on-time output voltage monitoring unit 122'A and the off-time output voltage monitoring unit 122'B have the same configurations as the on-time output voltage monitoring unit 122A and the off-time output voltage monitoring unit 122B, detailed description thereof is omitted. The signs of the components of the on-time output voltage monitoring unit 122' A and the off-time output voltage monitoring unit 122'B are obtained by adding quotation """ to the signs of the on-time output voltage monitoring unit 122A and the off-time output voltage monitoring unit 122B.

An output terminal of the comparator 135 is connected to a first input terminal of the OR circuit 137. The output terminal of the comparator 135' is connected to the second input terminal of the OR circuit 137. The output terminal of the OR circuit 137 is connected to the fusing signal output circuit 23. The OR circuit 137 outputs predetermined failure detection signals KD1 based on the monitoring results of the comparators 135 and 135'.

Similarly, the failure detection circuits 121-2 to 121-$m$ respectively output predetermined failure detection signals KD2 to KDm based on the monitoring result.

Figure 14:
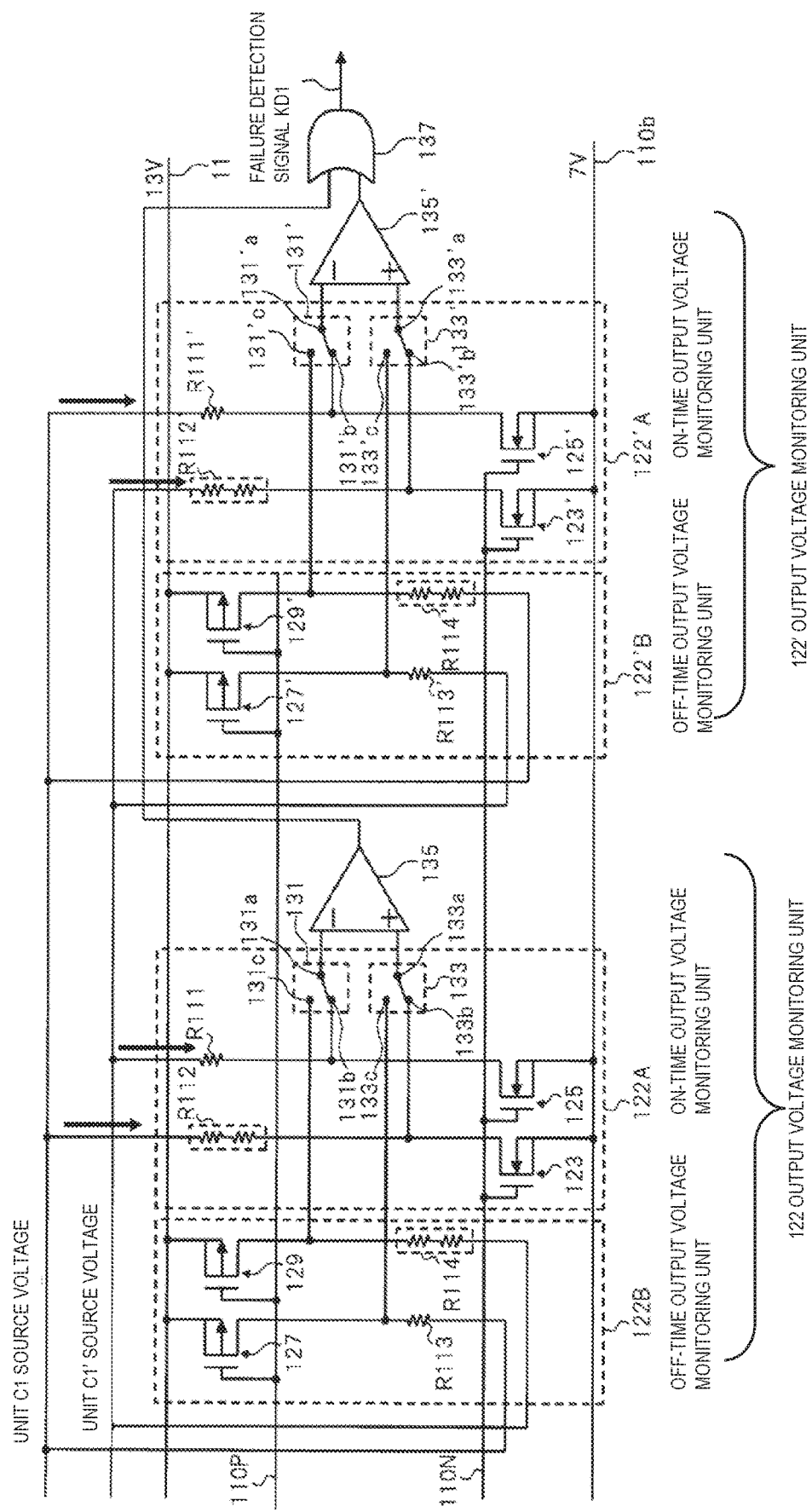
FIG. 14 is as explanation diagram showing a failure detection operation in an on state.

(Action of detecting a failure in on state) (Action in normal state) Next, a failure detection operation in the present embodiment will be described. FIG. 14 is an explanatory diagram of the failure detection operation in the on state. In the following, the failure detection operation will be described by taking the failure detection circuit 121-1 as an example. When the input signal is at a high level, the power control device 110 is turned on. At this time, the switches 131 and 133 connect the output terminals 131$a$ and 133$a$ to the first input terminals 131$b$ and 133$b$, respectively. Similarly, the switches 131' and 133' connect the output terminals 131'$a$ and 133'$a$ to the first input terminals 131'$b$ and 133'$b$, respectively.

If no failure occurs in the output transistor, the source voltages of the units C1 and C1' become, for example, about 13 V, and become substantially the same voltage. The voltage of the inner power supply terminal 110$b$ is set to a constant voltage lower than the source voltage, for example, about 7 V. The resistance value of the resistance element R111 is smaller than the resistance element R112. Therefore, the voltage of the first input terminal 131$b$ of the switch 131 becomes higher than the voltage of the first input terminal 133 $b$ of the switch 133. Therefore, the comparator 135 outputs a low-level signal.

Similarly, in the on-time output voltage monitoring unit 122', since the voltage of the first input terminal 131'$b$ of the switch 131' is higher than the voltage of the first input terminal 133'$b$ of the switch 133', the comparator 135' outputs a low-level signal.

A low-level signal output from the comparators 135 and 135' is input to each input terminal of the OR circuit 137. Therefore, the OR circuit 137 outputs a low-level signal.

Next, a case where a failure occurs in the output transistor of the unit C1 will be described. For example, when the source voltage of the unit C1 drops due to the occurrence of a failure, the voltage of the first input terminal 133$b$ of the switch 133 drops in the output voltage monitoring unit 122. On the other hand, the voltage of the first input terminal 131$b$ of the switch 131 is substantially the same as that in the normal state. Therefore, in the comparator 135, since the negative side terminal has a higher voltage than the positive side terminal, the comparator 135 outputs a low-level signal.

On the other hand, in the output voltage monitoring unit 122', the voltage of the first input terminal 131'$b$ of the switch 131' is lowered. On the other hand, the voltage of the first input terminal 133'$b$ of the switch 133' is substantially the same as that in the normal state. Therefore, in the comparator 135', when the voltage of the positive terminal becomes higher than that of the negative terminal, the comparator 135' outputs a high-level signal.

The OR circuit 137 outputs a high-level failure detection signal KD1 based on the high-level signal outputted from the comparator 135'. As described above, when the source voltage of the unit C1 drops, the output voltage monitoring unit 122' detects a failure.

Next, when the source voltage of the unit C1 rises due to the occurrence of a failure, the voltage of the first input terminal 133$b$ of the switch 133 rises in the on-time output voltage monitoring unit 122A. On the other hand, the voltage of the first input terminal 131$b$ of the switch 131 is substantially the same as that in the normal state. Therefore, in the comparator 135, when the voltage of the positive terminal becomes higher than that of the negative terminal, the comparator 135 outputs a high-level signal.

On the other hand, in the output voltage monitoring unit 122', the voltage of the first input terminal 131'$b$ of the switch 131' rises. On the other hand, the voltage of the first input terminal 133'$b$ of the switch 133' is substantially the same as that in the normal state. Therefore, in the comparator 135', since the negative side terminal has a higher voltage than the positive side terminal, the comparator 135 outputs a low-level signal.

The OR circuit 137 outputs a high-level failure detection signal KD1 based on the high-level signal outputted from the comparator 135. As described above, when the source voltage of the unit C1 rises, the output voltage monitoring unit 122 detects a failure.

Next, a case where the output transistor of the unit C1' fails will be described. When the source voltage of the unit C1' drops due to the occurrence of a failure, the voltage of the first input terminal 131$b$ of the switch 131 drops in the output voltage monitoring unit 122. On the other hand, the voltage of the first input terminal 133$b$ of the switch 133 is substantially the same as that in the normal state. Therefore, in the comparator 135, when the voltage of the positive terminal becomes higher than that of the negative terminal, the comparator 135 outputs a high-level signal.

On the other hand, in the output voltage monitoring unit 122', the voltage of the first input terminal 133'$b$ of the switch 133' is lowered. On the other hand, the voltage of the first input terminal 131'$b$ of the switch 131' is substantially the same as that in the normal state. Therefore, in the comparator 135', since the negative side terminal has a higher voltage than the positive side terminal, the comparator 135' outputs a low-level signal.

The OR circuit 137 outputs a high-level failure detection signal KD1 based on the high-level signal outputted from the comparator 135. As described above, when the source voltage of the unit C1' drops, the output voltage monitoring unit 122 detects a failure.

Next, when the source voltage of the unit C1' rises due to the occurrence of a failure, the voltage of the first input terminal 133'$b$ of the switch 133' rises in the on-time output voltage monitoring unit 122'A. On the other hand, the voltage of the first input terminal 131'$b$ of the switch 131' is substantially the same as that in the normal state. Therefore, in the comparator 135', since the positive side terminal has a higher voltage than the negative side terminal, the comparator 135' outputs a high-level signal.

On the other hand, in the output voltage monitoring unit 122, the voltage of the first input terminal 131$b$ of the switch 131 rises. On the other hand, the voltage of the first input terminal 133$b$ of the switch 133 is substantially the same as that in the normal state. Therefore, in the comparator 135, since the negative side terminal has a higher voltage than the positive side terminal, the comparator 135 outputs a low-level signal.

The OR circuit 137 outputs a high-level failure detection signal KD1 based on the high-level signal outputted from the comparator 135'. When the source voltage of the unit C1' rises in this manner, the output voltage monitoring unit 122' detects a failure.

Figure 15:
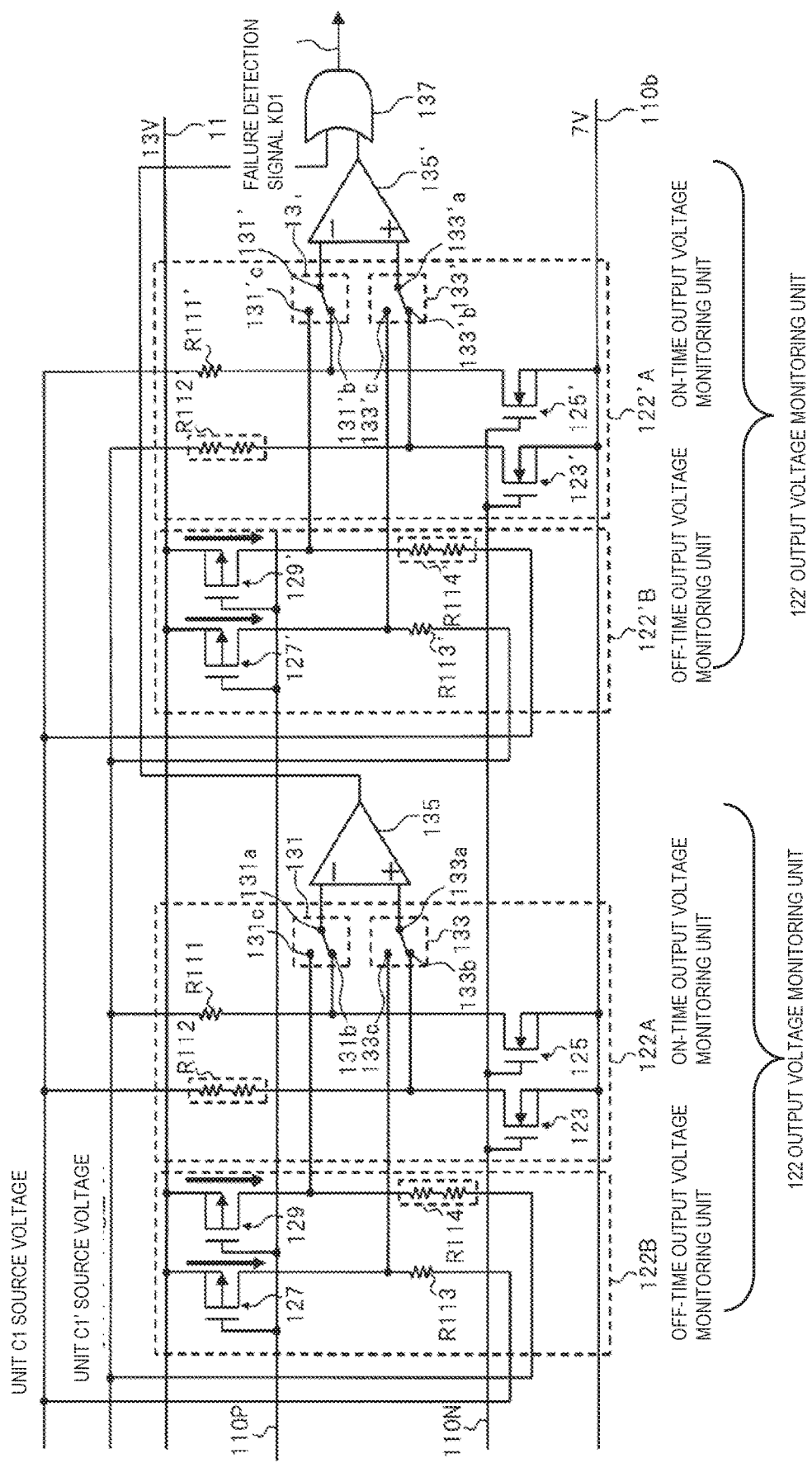
FIG. 15 is an explanation of the failure detection operation in the off state.

FIG. 15 is an explanatory diagram of a failure detection operation in an off state. When the input signal is at a low level, the power control device 110 is turned off. At this time, the switches 131 and 133 connect the output terminals 131a and 133a to the second input terminals 131c and 133c, respectively. Similarly, the switches 131' and 133' connect the output terminals 131'a and 133'a to the second input terminals 131'c and 133'c, respectively.

If no failure occurs in the output transistor, the source voltages of units C1 and C1' are, for example, on the order of 0 V, and become approximately the same voltages as each other. The voltage of the power supply terminal 11 is set to a constant voltage higher than the source voltage, for example, about 13 V. The resistance value of the resistance element R113 is smaller than the resistance element R114. Therefore, the voltage of the second input terminal 131c of the switch 131 becomes higher than the voltage of the second input terminal 133c of the switch 133. Therefore, the comparator 135 outputs a low-level signal.

Similarly, in the output voltage monitoring unit 122', since the voltage of the second input terminal 131'c of the switch 131' is higher than the voltage of the second input terminal 133'c of the switch 133', the comparator 135' outputs a low-level signal. The OR circuit 137 outputs a low-level signal.

Next, a case where a failure occurs in the output transistor of the unit C1 in the OFF state will be described. When the source voltage of the unit C1 rises due to the occurrence of a failure, the voltage of the second input terminal 133c of the switch 133 rises in the output voltage monitoring unit 122. On the other hand, the voltage of the second input terminal 131c of the switch 131 is substantially the same as that in the normal state. Therefore, in the comparator 135, when the voltage of the positive terminal becomes higher than that of the negative terminal, the comparator 135 outputs a high-level signal.

On the other hand, in the output voltage monitoring unit 122', the voltage of the second input terminal 131'c of the switch 131' rises. On the other hand, the voltage of the second input terminal 133'c of the switch 133' is substantially the same as that in the normal state. Therefore, in the comparator 135', since the negative side terminal has a higher voltage than the positive side terminal, the comparator 135' outputs a low-level signal.

The OR circuit 137 outputs a high-level failure detection signal KD1 based on the high-level signal outputted from the comparator 135. As described above, when the source voltage of the unit C1 rises, the output voltage monitoring unit 122 detects a failure.

Next, a case where the output transistor of the unit C1' fails will be described. When the source voltage of the unit C1' rises due to the occurrence of a failure, the voltage of the second input terminal 131 c of the switch 131 rises in the output voltage monitoring unit 122. On the other hand, the voltage of the second input terminal 133c of the switch 133 is substantially the same as that in the normal state. Therefore, in the comparator 135, since the negative side terminal has a higher voltage than the positive side terminal, the comparator 135 outputs a low-level signal.

On the other hand, in the output voltage monitoring unit 122', the voltage of the second input terminal 133'c of the switch 133' rises. On the other hand, the voltage of the second input terminal 131c of the switch 131' is substantially the same as that in the normal state. Therefore, in the comparator 135', when the voltage of the positive terminal becomes higher than that of the negative terminal, the comparator 135' outputs a high-level signal.

The OR circuit 137 outputs a high-level failure detection signal KD1 based on the high-level signal outputted from the comparator 135'. When the source voltage of the unit C1' rises in this manner, the output voltage monitoring unit 122' detects a failure.

The failure detection circuit 121-1 performs failure detection of the output transistor in both the ON state and the OFF state by switching the switch in accordance with the level of the input signal.

Similarly, the other failure detection circuits 121-2 to 121-n perform the failure detection operation for the corresponding units C2, C2' to Cm, Cm', and outputs the high-level failure detection signals KD2 to KDm when the failure is detected.

FIG. 16 is a table listing the operation of the failure detection circuit of FIG. 13. Similar to FIG. 4, FIG. 16 shows the state (normal or failure) of the output transistor, the input signal from the microcomputer 3, the source voltage of the output transistor, the logic (determination result) of the failure detection circuit 121, and the failure detection signal. As shown in FIG. 16, in the present embodiment, even in the on-state, the failure of the output transistor is detected.

When any one of the failure detection signals is output from the failure detection circuits 121-1 to 121-n, the fuse signal output circuit 23 performs the wire fuse process. The wire fusing process is basically the same as that of first embodiment. More specifically, the fusing signal output circuit 23 sequentially outputs fusing signals in the order of, for example, the gate drive circuits 15-1, 15-2, . . . , 15-m.

When a fusing signal is input to the corresponding gate driving circuits 15-1 to 15-m, the gate separation circuits 17-1 to 17-m output gate signals for turning on the output transistors of the corresponding pair of units for a predetermined period. As a result, the wire fusing process is sequentially performed for each pair of units.

Also in the present embodiment, if the fuse of the bonding wire cannot be detected after the wire fuse process is completed, the on-time of the outputting transistor is set to be long, and the wire fuse process is performed again.

In present embodiment, the number of output transistors that are simultaneously turned on is twice the number of output transistors that are simultaneously turned on, i.e., the number of output transistors that are turned on is twice the number of output transistors that are simultaneously turned on, i.e., first embodiment. Therefore, the gate isolation circuits 17-1 to 17-m may turn on only the output transistor of one unit of the pair of units, and then turn on only the output transistor of the other unit. In this manner, the wire fusing process may be performed.

According to the present embodiment, the failure detection circuits 121 (121-1 to 121-m) detect a failure of the power control device 110 (output transistor) by comparing the source voltages of the pair of units. According to this configuration, even when the output transistor is in the on state, it is possible to detect a failure of the output transistor.

Next, third embodiment will be described. Present embodiment will describe a semiconductor device in which a wire fusing process is performed only on a pair of units including a failed output transistor.

Figure 17:
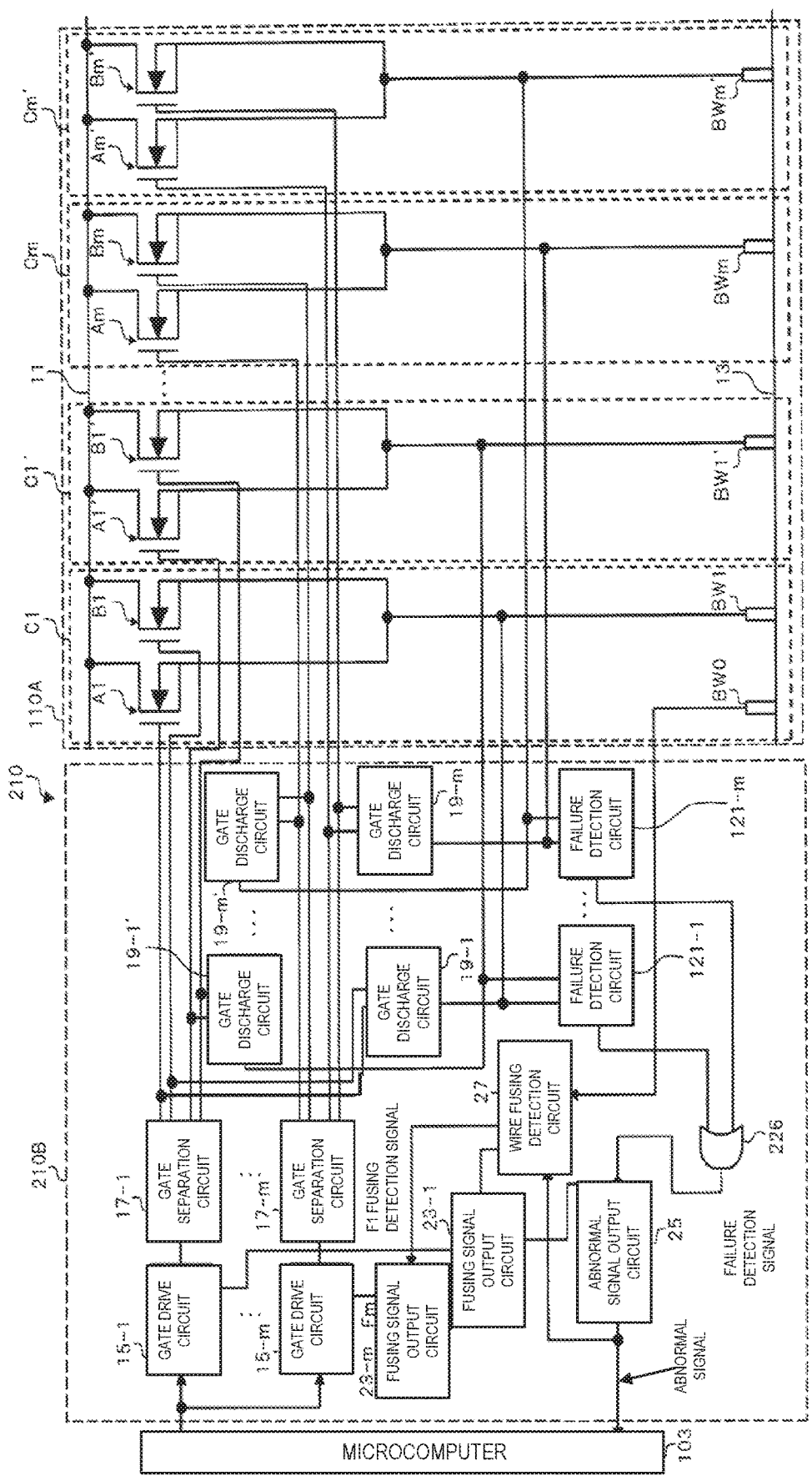
FIG. 17 is a circuit diagram showing an exemplary configuration of a semiconductor device according to a third embodiment.

FIG. 17 is a circuit diagram showing an exemplary configuration of a power control device according to the present third embodiment. The power control device 210 is mounted on, for example, the semiconductor device 101 of FIG. 11. As shown in FIG. 17, the power control device 210 includes a power outputting unit 110A and a control unit 210B.

The control unit 210B differs from the control unit 110B of FIG. 12 in that a plurality of fusing signal output circuits 23-1 to 23-m are provided and an OR circuit 226 is provided.

The fusing signal output circuits 23-1 to 23-m are provided corresponding to the failure detection circuits 121-1 to 121-m, respectively. The configuration of the fusing signal output circuits 23-1 to 23-m is the same as that of the fusing signal output circuit 23 of FIGS. 2 and 12. The input sides of the fusing signal output circuits 23-1 to 23-m are connected to the corresponding failure detection circuits 121-1 to 121-m, respectively. Output sides of the fusing signal output circuits 23-1 to 23-m are connected to corresponding gate drive circuits 15-1 to 15-m, respectively. The fusing signal output circuits 23-1 to 23-m are connected to the wire fusing detection circuit 27, respectively.

When the failure detection signals KD1 to KDn are output from the corresponding failure detection circuits 121-1 to 121-m, the fusing signal output circuits 23-1 to 23-m output the fusing signals F1 to Fm to the corresponding gate drive circuits 15-1 to 15-m, respectively.

The OR circuit 226 is a functional block that, when a failure detection signal is output from any of the failure detection circuits, notifies an abnormality signal that a failure has been detected. The input terminals of the OR circuit 226 are connected to the failure detection circuits 121-1 to 121-m, respectively. The output terminal of the OR circuit 226 is connected to the abnormal signal output circuit. The OR circuit 226 may be configured by combining a plurality of 2-input or 3-input OR circuits, for example, or may be configured by only m-input OR circuits if the number of failure detection circuits is small.

Since the failure detection operation is the same as that of the embodiment, the description thereof is omitted. When the failure detection signal KD2 is output from any one of the failure detection circuits (for example, 121-2), the corresponding fusing signal output circuit 23-2 outputs the fusing signal F 2 to the corresponding gate driving circuit 15-2. At this time, all of the gate driving circuits 15-1 to 15-m ignore the input signal based on the abnormal signal and the failure detection signal KD2.

The gate driving circuit 15-2 turns on only the output transistors of the units C2 and C2' for a predetermined period via the gate separation circuit 19-2 based on the fusing signal F2. As a result, the bonding wire BW2 of the unit C2 and the bonding wire BW2' of the unit C2' are fused and cut. When the bonding wire BW2,BW2' is fused, the wire fusing detection circuit 27 detects the wire fusing and outputs a corresponding wire fusing detection signal FD2.

When the wire fusing detection signal FD2 is not output within the predetermined period in which the fusing signal F2 is output, the fusing signal output circuit 23-2 sets the ON time of the output transistor (the output time of the fusing signal) to be long in the manner already described, and the wire fusing processing is performed again on the units C2 and C2'. The cutting signal output circuit 23-2 may stop the output of the cutting signal F2 when the wire fusing detection signal FD2 is output.

When the wire fusing process is completed, the other gate driving circuits 15-1 and 15-3 to 15-m resume normal operation based on the inputted signal, for example, based on a signal such as a fusing detection signal, for example, FD2.

When a plurality of failure detection signals are output at the same time, the wire fusing process corresponding to each failure detection signal is sequentially performed. When all of these wire fusing processes are completed, normal operation is started.

According to the present embodiment, the wire fusing process is performed only on the output transistors of the pair of units in which a failure has been detected. According to this configuration, it is possible to disconnect only a pair of units in which a failure has been detected, and continue the operation of the load by the remaining normal units.

Next, fourth embodiment will be described. In present embodiment, a semiconductor device of performing a wire fusing process by PWM (Pulse Width Modulation) control will be described.

Figure 18:
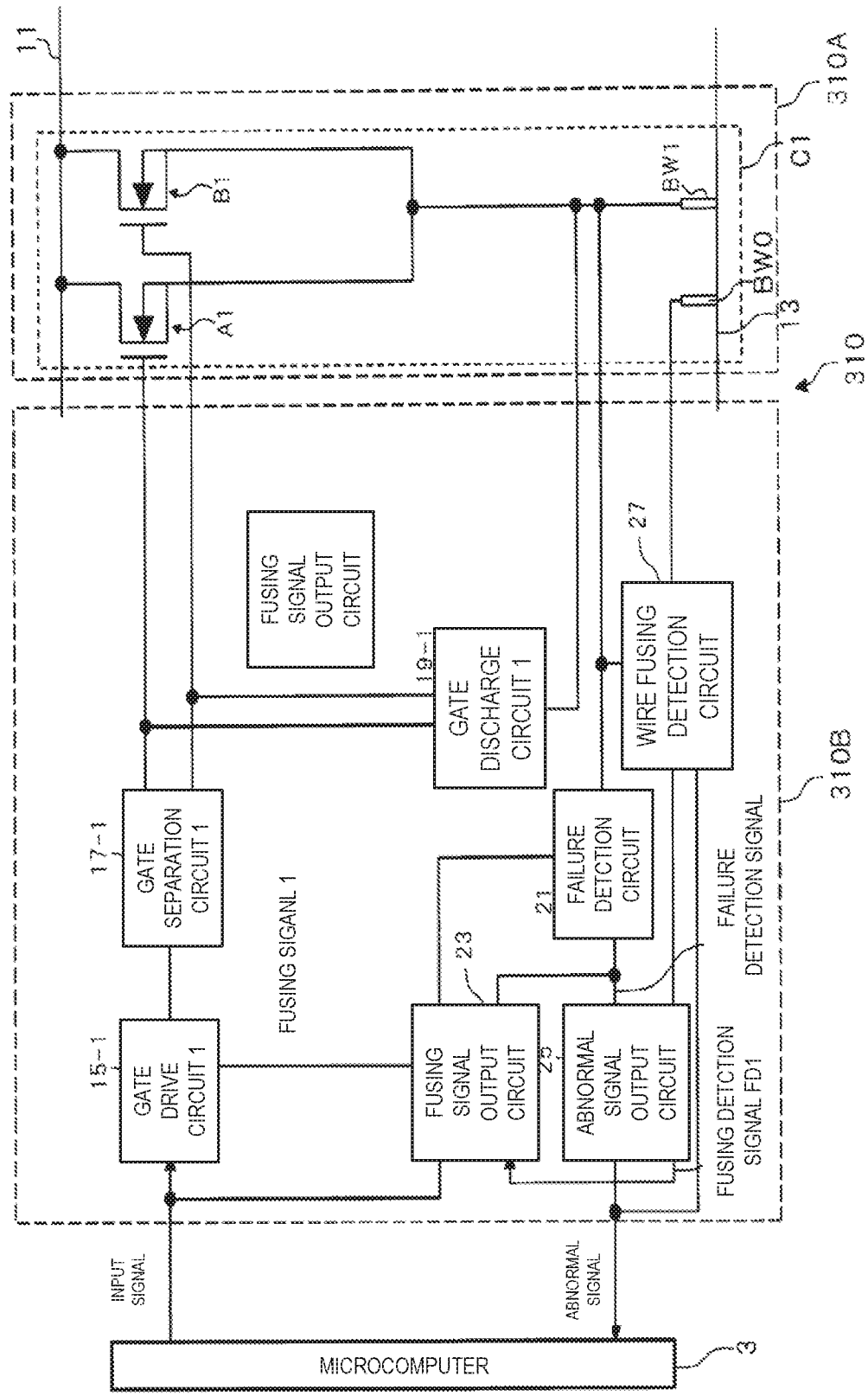
FIG. 18 is a circuit diagram showing an exemplary configuration of a semiconductor device according to a fourth embodiment.

FIG. 18 is a circuit diagram showing an exemplary configuration of a power control device according to the present fourth embodiment. As shown in FIG. 18, the power control device 310 includes a power outputting unit 310A and a control unit 310 B. The power output unit 310A includes only the unit C1 of the power output unit 10A of FIG. 2.

Comparing the control unit 310B with FIG. 2, only one gate driving circuit, one gate separating circuit, and one gate discharging circuit are provided. Other circuit configurations of the control unit 310B are the same as those of FIG. 2.

When the failure detection circuit 21 outputs the failure detection signal, the fusing signal output circuit 23 outputs the fusing signal to the gate driving circuit 15-1. Then, the gate driving circuit 15-1 performs a wire fusing process for improving the duty of the input signal for driving the output transistors A1 and B1 of the unit C1 by the PWM control. For example, the gate driving circuit 15-1 performs the wire fusing process by setting the duty of the input signal to 100%.

The gate driving circuit 15-1 sets the duty of the input signal to 100% for a predetermined period in which the fusing signal is output. When the predetermined period elapses and the output of the fusing signal is stopped, the gate driving circuit 15-1 returns the duty of the input signal to the normal state. However, since the bonding wire BW1 of the unit C1 is fused, no current flows from the battery to the loads.

When the wire fusing detection signal is not output from the wire fusing detection circuit 27 within the predetermined period, the fusing signal output circuit 23 sets the output time of the fusing signal to be long, and the wire fusing treatment is performed again.

According to the present embodiment, the gate driving circuit 15 includes only one unit C1, and the gate driving circuit 15 performs a wire fusing process for improving the duty of the input signal by PWM control. According to this configuration, since the control for ignoring the input signal is unnecessary at the time of failure detection, the current path can be separated by only one unit. In addition, the circuit configuration is simplified.

The output transistor driving circuit 15-1 performs the wire fusing process by setting the duty of the input signal to 100%. This makes it possible to perform the wire fusing process over a plurality of cycles.

Although the invention made by the present inventor has been specifically described based on the embodiment, the present invention is not limited to the embodiment described above, and it is needless to say that various modifications can be made without departing from the gist thereof.

What is claimed is:

1. A semiconductor device, comprising:
an output transistor;
an output terminal;
a bonding wire connecting the output transistor and the output terminal;
an output transistor driving circuit for controlling an output of the output transistor; and
a failure detection circuit for detecting a failure of the output transistor,
wherein when the failure detection circuit detects a failure of the output transistor and outputs a failure detection signal, the output transistor driving circuit controls an output of the output transistor so that current larger than current at a time of failure non-detection flows through the bonding wire,
wherein the semiconductor device further comprises:
a plurality of units each comprising a bonding wire and a corresponding output transistor;
a plurality of output transistor driving circuits corresponding to the respective units; and
a fusing signal output circuit,
wherein when the failure detection circuit outputs the failure detection signal, the fusing signal output circuit sequentially performs wire fusing processes for all the output transistor driving circuits, wherein the fusing signal output circuit outputs a fusing signal to corresponding output one transistor driving circuit for turning on the output transistor of corresponding one unit,
wherein the semiconductor device further comprises a wire fusing detection circuit connected to the output terminal, the wire fusing detection circuit detecting the fusing of the bonding wires of the plurality of units; and
wherein when the wire fusing detection circuit fails to detect the fusing of the bonding wires after an end of the wire fusing process for a last unit, the fusing signal output circuit sets an ON time of the output transistors longer than that of the previous wire fusing processes, and the output transistor driving circuits sequentially perform the wire fusing processes again based on the long set ON time.

2. The semiconductor device according to claim 1, wherein each unit comprises a plurality of output transistors, the plurality of output transistors being connected in parallel with each other.

3. The semiconductor device according to claim 1, wherein each of the output transistor driving circuits controls the output transistor of the corresponding unit based on the fusing signal when the failure detection signal is output.

4. The semiconductor device according to claim 1, further comprising:
an abnormal signal output circuit for outputting an abnormal signal based on the failure detection signal, and each of the output transistor driving circuits controls the output transistor of the corresponding unit based on the fusing signal when the abnormal signal is output.

5. A semiconductor device, comprising:
an output transistor;
an output terminal;
a bonding wire connecting the output transistor and the output terminal;
an output transistor driving circuit for controlling an output of the output transistor; and
a failure detection circuit for detecting a failure of the output transistor,
wherein when the failure detection circuit detects a failure of the output transistor and outputs a failure detection signal, the output transistor driving circuit controls an output of the output transistor so that current larger than current at the time of failure non-detection flows through the bonding wire,
wherein the semiconductor device further comprises:
a plurality of units each comprising a bonding wire and a corresponding output transistor;
a plurality of output transistor driving circuits corresponding to the respective units; and
a fusing signal output circuit,
wherein when the failure detection circuit outputs the failure detection signal, the fusing signal output circuit sequentially performs wire fusing processes for all the output transistor driving circuits, wherein the fusing signal output circuit outputs a fusing signal to corresponding output one transistor driving circuit for turning on the output transistor of corresponding one unit, and
wherein each of a pair of units includes one output transistor driving circuit and one failure detecting circuit, wherein the one failure detecting circuit detects a fault of the output transistor by comparing source voltages of the output transistors included in the corresponding pair of units.

6. The semiconductor device according to claim 5, wherein each of the failure detection circuits comprises an on-time output voltage monitor for monitoring the source voltage of each of the units when the output transistor is on, and an off-time output voltage monitor for monitoring the source voltage of each of the units when the output transistor is off, and switches the on-time output voltage monitor or off-time output voltage monitor in response to on/off of the output transistor to detect a fault in the output transistor.

7. The semiconductor device according to claim 5,
wherein the fusing signal output circuit corresponds to each of the failure detection circuits,
wherein when the failure detection circuit detects a failure of the output transistor, the corresponding fusing signal output circuit outputs the fusing signal for turning on only the output transistor included in the corresponding pair of units to the corresponding output transistor driving circuit.

8. A semiconductor device, comprising:
an output transistor;
an output terminal;
a bonding wire connecting the output transistor and the output terminal;
an output transistor driving circuit for controlling an output of the output transistor; and
a failure detection circuit for detecting a failure of the output transistor,
wherein when the failure detection circuit detects a failure of the output transistor and outputs a failure detection signal, the output transistor driving circuit controls an output of the output transistor so that current larger than current at a time of failure non-detection flows through the bonding wire,
wherein one unit comprising one bonding wire and corresponding output transistor, and
wherein when the failure detection circuit outputs the failure detection signal, the output transistor driving circuit performs a wire fusing process for improving a duty of an input signal for driving the output transistor of the unit by Pulse Width Modulation control.

9. The semiconductor device according to claim 8, wherein the output transistor driving circuit performs the wire fusing process by setting the duty of the input signal to 100% in the output transistor driving circuit semiconductor device.

10. The semiconductor device according to claim 8,
   wherein said unit comprises a plurality of said output transistors, said plurality of output transistors being connected in parallel with each other.

* * * * *